(12) United States Patent
Sano et al.

(10) Patent No.: US 7,771,845 B2
(45) Date of Patent: Aug. 10, 2010

(54) ORGANIC ELECTROLUMINESCENT DEVICE

(75) Inventors: Satoshi Sano, Minami-Ashigara (JP); Tatsuya Igarashi, Minami-Ashigara (JP); Toshihiro Ise, Minami-Ashigara (JP); Takeshi Murakami, Minami-Ashigara (JP); Seiji Ichijima, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 1154 days.

(21) Appl. No.: 11/374,148

(22) Filed: Mar. 14, 2006

(65) Prior Publication Data

US 2006/0204787 A1  Sep. 14, 2006

(30) Foreign Application Priority Data

Mar. 14, 2005  (JP) ............... P.2005-070992
Sep. 5, 2005  (JP) ............... P.2005-256797

(51) Int. Cl.
*H01L 51/54* (2006.01)
*C09K 11/06* (2006.01)

(52) U.S. Cl. ............... 428/690; 428/917; 313/504; 257/E51.044; 548/103

(58) Field of Classification Search ............... None
See application file for complete search history.

(56) References Cited

U.S. PATENT DOCUMENTS

| | | | |
|---|---|---|---|
| 6,303,231 B1 | 10/2001 | Sawada et al. | |
| 6,303,238 B1 | 10/2001 | Thompson et al. | |
| 6,653,654 B1 | 11/2003 | Che | |
| 7,569,692 B2 | 8/2009 | Nii et al. | |
| 2002/0008233 A1 | 1/2002 | Forrest et al. | |
| 2002/0013306 A1 | 1/2002 | Lowe | |
| 2002/0068190 A1 | 6/2002 | Tsuboyama et al. | |
| 2003/0205707 A1 | 11/2003 | Chi-Ming | |
| 2005/0170209 A1 | 8/2005 | Lee et al. | |
| 2005/0227112 A1 | 10/2005 | Ise et al. | |
| 2006/0073359 A1* | 4/2006 | Ise et al. | 428/690 |
| 2006/0134460 A1 | 6/2006 | Kondakova et al. | |
| 2006/0134461 A1* | 6/2006 | Huo et al. | 428/690 |
| 2006/0264625 A1 | 11/2006 | Nakayama et al. | |
| 2006/0286406 A1 | 12/2006 | Igarashi et al. | |
| 2007/0082284 A1 | 4/2007 | Stoessel et al. | |
| 2007/0103060 A1 | 5/2007 | Itoh et al. | |
| 2008/0036373 A1 | 2/2008 | Itoh et al. | |
| 2009/0128008 A1 | 5/2009 | Ise et al. | |

FOREIGN PATENT DOCUMENTS

| | | |
|---|---|---|
| EP | 0 969 532 A2 | 1/2000 |
| JP | 5-9470 A | 1/1993 |
| JP | 2000-048960 A | 2/2000 |
| JP | 2001-338768 A | 12/2001 |
| JP | 2002-175844 A | 6/2002 |
| JP | 2002-305083 A | 10/2002 |
| JP | 2002-363552 A | 12/2002 |
| JP | 2003-123976 A | 4/2003 |
| JP | 2003-123981 A | 4/2003 |
| JP | 2004-331508 A | 11/2004 |
| JP | 2005-220136 A | 8/2005 |
| JP | 2005-310733 A | 11/2005 |
| JP | 2005-317516 A | 11/2005 |
| JP | 2006-093542 A | 4/2006 |
| JP | 2006-120811 A | 5/2006 |
| JP | 2006-256999 A | 9/2006 |
| JP | 2006-261623 A | 9/2006 |
| JP | 2006-332620 A | 12/2006 |
| JP | 2007-019462 A | 1/2007 |
| JP | 2007-073845 A | 3/2007 |
| JP | 2008-037848 A | 2/2008 |
| JP | 2008-103535 A | 5/2008 |
| WO | WO-00/57676 A1 | 9/2000 |
| WO | WO-03/093283 A1 | 11/2003 |
| WO | WO-2004/039914 A1 | 5/2004 |
| WO | WO-2004/108857 A1 | 12/2004 |
| WO | WO-2005/042444 A1 | 5/2005 |
| WO | WO 2005/042550 A1 * | 5/2005 |
| WO | WO 2006/033440 A1 * | 3/2006 |

OTHER PUBLICATIONS

Japanese Office Action and Translation issued in corresponding Japanese Application No. 2004-279153 (dated Oct. 29, 2009).
Baldo et al., Nature, vol. 395, pp. 151-154 (1998).
Japanese Office Action and English Translation, JP2006-066647, Nov. 11, 2009, 7 pages.
Y-Y. Lin et al., Chemistry European Journal, "Structural, Photophysical, and Electrophosphorescent Properties of Platinum(II) Complexes Supported by Tetradentate $N_2O_2$ Chelates," vol. 9, No. 6, 2003, pp. 1263-1272.

\* cited by examiner

*Primary Examiner*—Marie R. Yamnitzky
(74) *Attorney, Agent, or Firm*—Birch, Stewart, Kolasch & Birch, LLP

(57) ABSTRACT

An organic electroluminescent device contains: a pair of electrodes; and an organic compound layer containing a light-emitting layer, the organic compound layer being between the electrodes, wherein the organic compound layer contains a platinum complex including specific structure.

12 Claims, No Drawings

ORGANIC ELECTROLUMINESCENT DEVICE

BACKGROUND OF THE INVENTION

1. Field of the Invention

The present invention relates to a metallic complex compound and an organic electroluminescent device containing the compound.

2. Background Art

At this time, such organic electroluminescent devices (hereinafter also simply as referred to organic EL devices) have been known that use a tetradentate platinum complex including a platinum complex with phenylpyridine ligand and a platinum complex with phenoxypyridine ligand (refer to International Publication No. 04/108857), and a tetradentate platinum complex including a platinum complex with octaethylporphirin ligand (refer to U.S. Pat. No. 6,303,238 B1 and U.S. Pat. No. 6,653,654 B1). However, there are demands that decrease luminescence wavelength in luminescence characteristics, and improve in durability.

SUMMARY OF THE INVENTION

It is an object of the invention to provide such an organic electroluminescent device, which is excellent in luminescent characteristics (such as luminescent wavelength, brightness, quantum yield and driving voltage) and durability.

The invention provides the following.

(1) An organic electroluminescent device comprising: a pair of electrodes; and an organic compound layer comprising a light-emitting layer, the organic compound layer being between the electrodes, wherein the organic compound layer comprising at least one compound represented by formula (I):

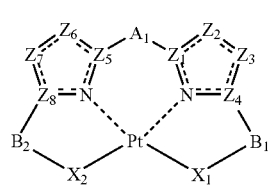

Formula (I)

wherein $Z_1$, $Z_2$, $Z_3$, $Z_4$, $Z_5$, $Z_6$, $Z_7$ and $Z_8$ each independently represents an atom selected from the group consisting of carbon, nitrogen, oxygen, sulfur and silicon; each of interatomic bonds in 5-membered ring including $Z_1$, $Z_2$, $Z_3$, $Z_4$ and the nitrogen atom, and 5-membered ring including $Z_5$, $Z_6$, $Z_7$, $Z_8$ and the nitrogen atom represent a single bond or a double bond; $Z_1$, $Z_2$, $Z_3$, $Z_4$, $Z_5$, $Z_6$, $Z_7$ and $Z_8$ each may have a substituent; $A_1$ represents a divalent linking group; $B_1$ and $B_2$ each independently represents a single bond or a divalent linking group; and $X_1$ and $X_2$ each represents a partial structure containing an atom bonded to a platinum atom, provided that $X_1$ and $X_2$ are not connected to each other to form a ring.

(2) The organic electroluminescent device according to the item (1), wherein the compound represented by the formula (I) is a compound represented by one of formulae (II) and (III):

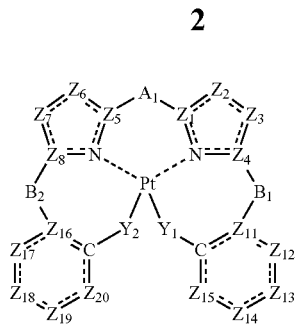

Formula (II)

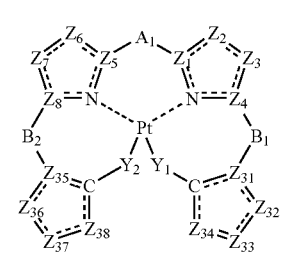

Formula (III)

wherein $Z_1$, $Z_2$, $Z_3$, $Z_4$, $Z_5$, $Z_6$, $Z_7$, $Z_8$, $A_1$, $B_1$ and $B_2$ have the same meanings as in the formula (I); $Z_{11}$, $Z_{12}$, $Z_{13}$, $Z_{14}$, $Z_{15}$, $Z_{16}$, $Z_{17}$, $Z_{18}$, $Z_{19}$, $Z_{20}$, $Z_{31}$, $Z_{32}$, $Z_{33}$, $Z_{34}$, $Z_{35}$, $Z_{36}$, $Z_{37}$ and $Z_{38}$ each independently represents an atom selected from the group consisting of carbon, nitrogen, oxygen, sulfur and silicon, and each may have a substituent; and $Y_1$ and $Y_2$ each independently represents an oxygen atom, a sulfur atom, a substituted or unsubstituted nitrogen atom, or a single bond.

(3) The organic electroluminescent device according to the item (2), wherein the compound represented by the formula (II) is a compound represented by formula (IIA):

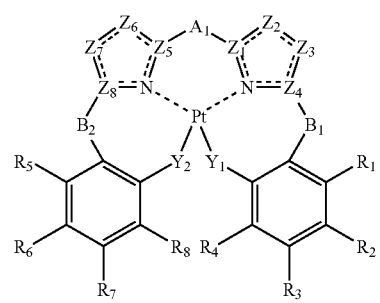

Formula (IIA)

wherein $Z_1$, $Z_2$, $Z_3$, $Z_4$, $Z_5$, $Z_6$, $Z_7$, $Z_8$, $A_1$, $B_1$, $B_2$, $Y_1$ and $Y_2$ have the same meanings as in the formula (II); and $R_1$, $R_2$, $R_3$, $R_4$, $R_5$, $R_6$, $R_7$ and $R_8$ each independently represents a hydrogen atom or a substituent.

(4) The organic electroluminescent device according to the item (3), wherein the compound represented by the formula (IIA) is a compound represented by formula (IIB):

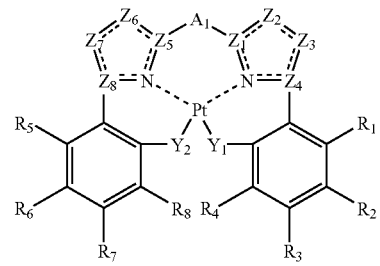

Formula (IIB)

wherein $Z_1$ $Z_2$, $Z_3$, $Z_4$, $Z_5$, $Z_6$, $Z_7$, $Z_8$, $A_1$, $Y_1$, $Y_2$, $R_1$, $R_2$, $R_3$, $R_4$, $R_5$, $R_6$, $R_7$ and $R_8$ have the same meanings as in the formula (IIA).

(5) The organic electroluminescent device according to the item (4), wherein the compound represented by the formula (IIB) is a compound represented by formula (IIB1):

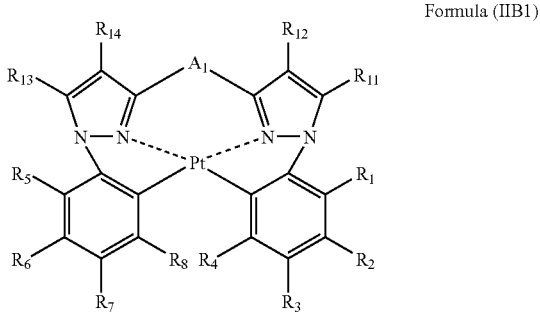

Formula (IIB1)

wherein $A_1$, $R_1$, $R_2$, $R_3$, $R_4$, $R_5$, $R_6$, $R_7$ and $R_8$ have the same meanings as in the formula (IIB), and $R_{11}$, $R_{12}$, $R_{13}$ and $R_{14}$ each independently represents a hydrogen atom or a substituent.

(6) The organic electroluminescent device according to the item (4), wherein the compound represented by the formula (IIB) is a compound represented by formula (IIB2):

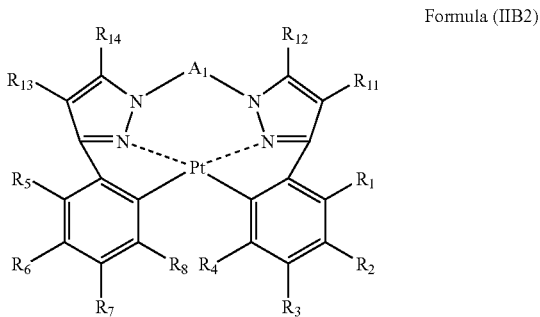

Formula (IIB2)

wherein $A_1$, $R_1$, $R_2$, $R_3$, $R_4$, $R_5$, $R_6$, $R_7$ and $R_8$ have the same meanings as in the formula (IIB), and $R_{11}$, $R_{12}$, $R_{13}$ and $R_{14}$ each independently represents a hydrogen atom and a substituent.

(7) The organic electroluminescent device according to the item (2), wherein the compound represented by the formula (III) is a compound represented by formula (IIIA):

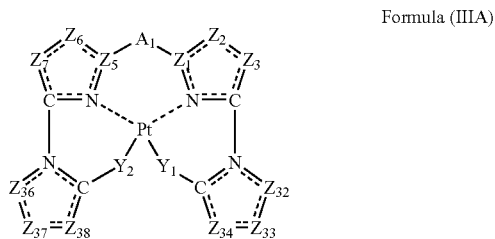

Formula (IIIA)

wherein $Z_1$, $Z_2$, $Z_3$, $Z_4$, $Z_5$, $Z_6$, $Z_7$, $A_1$, $Z_{32}$, $Z_{33}$, $Z_{34}$, $Z_{36}$, $Z_{37}$, $Z_{38}$, $Y_1$ and $Y_2$ have the same meanings as in the formula (III).

(8) The organic electroluminescent device according to the item (3), wherein $R_2$ and $R_6$ each represent a hydrogen atom.

(9) The organic electroluminescent device as according to the item (1), wherein $A_1$ represents a group selected from the group consisting of —$C(R_{25})(R_{26})$—, —$C(R_{27})(R_{28})C(R_{29})(R_{30})$—, —$Si(R_{31})(R_{32})$—, —$N(R_{35})$—, —O—, —S—, —SO—, —$SO_2$— and —CO—, wherein $R_{25}$, $R_{26}$, $R_{27}$, $R_{28}$, $R_{29}$, $R_{30}$, $R_{31}$, $R_{32}$ and $R_{35}$ each independently represents a hydrogen atom or a substituent.

According to the invention, an electroluminescent device having an organic compound layer that contains a platinum complex compound having the particular structure is excellent in luminescent characteristics (such as luminescent wavelength, brightness, quantum yield and driving voltage) and durability. The compound is a complex containing an organic ligand, whereby the compound is excellent in vapor deposition properties.

DETAILED DESCRIPTION OF THE INVENTION

The compound represented by the formulae (I), (II), (III), (IIA), (IIB), (IIB1), (IIB2) and (IIIA) is abbreviated as the compound of the invention in some cases. The organic electroluminescent device having an organic compound layer containing the compound of the invention is abbreviated as the device of the invention in some cases. The substituent group A referred herein is defined as follows.

(Substituent Group A)

The substituent group A includes an alkyl group (preferably having from 1 to 30 carbon atoms, more preferably having from 1 to 20 carbon atoms, and particularly preferably having from 1 to 10 carbon atoms, such as methyl, ethyl, iso-propyl, tert-butyl, n-octyl, n-decyl and n-hexadecyl), a cycloalkyl group (preferably having from 3 to 30 carbon atoms, more preferably having from 3 to 20 carbon atoms, and particularly preferably having from 3 to 10 carbon atoms, such as cyclopropyl, cyclopentyl and cyclohexyl), an alkenyl group (preferably having from 2 to 30 carbon atoms, more preferably having from 2 to 20 carbon atoms, and particularly preferably having from 2 to 10 carbon atoms, such as vinyl, allyl, 2-butenyl and 3-pentenyl), an alkynyl group (preferably having from 2 to 30 carbon atoms, more preferably having from 2 to 20 carbon atoms, and particularly preferably having from 2 to 10 carbon atoms, such as propargyl and 3-penthynyl), an aryl group (preferably having from 6 to 30 carbon atoms, more preferably having from 6 to 20 carbon atoms, and particularly preferably having from 6 to 12 carbon atoms, such as phenyl, p-methylphenyl, naphthyl and anthranyl), an amino group (preferably having from 0 to 30 carbon atoms, more preferably having from 0 to 20 carbon atoms, and particularly preferably having from 0 to 10 carbon atoms, such as amino, methylamino, dimethylamino, diethylamino, dibenzylamino, diphenylamino and ditolylamino), an alkoxy group (preferably having from 1 to 30 carbon atoms, more preferably having from 1 to 20 carbon atoms, and particularly preferably having from 1 to 10 carbon atoms, such as methoxy, ethoxy, butoxy and 2-ethylhexyloxy), an aryloxy group (preferably having from 6 to 30 carbon atoms, more preferably having from 6 to 20 carbon atoms, and particularly preferably having from 6 to 12 carbon atoms, such as phenyloxy, 1-naphthyloxy and 2-naphthyloxy), a heterocyclic oxy group (preferably having from 1 to 30 carbon atoms, more preferably having from 1 to 20 carbon atoms, and particularly preferably having from 1 to 12 carbon atoms, such as pyridyloxy, pyrazyloxy, pyrimidyloxy and quinolyloxy), an acyl group (preferably having from 1 to 30 carbon atoms, more preferably having from 1 to 20 carbon atoms, and particularly preferably having from 1 to 12 carbon atoms, such as acetyl, benzoyl, formyl and pivaloyl), an alkoxycarbonyl group (preferably having from 2 to 30 carbon atoms, more preferably having from 2 to 20 carbon atoms, and particularly preferably having from 2 to 12 carbon atoms, such as methoxycarbonyl and ethoxycarbonyl), an aryloxycarbonyl group (preferably having from 7 to 30 carbon atoms, more preferably having from 7 to 20 carbon atoms, and particularly preferably having from 7 to 12 carbon atoms, such as phenyloxycarbonyl), an acyloxy group (preferably having from 2 to 30 carbon atoms, more preferably having from 2 to 20 carbon atoms, and particularly preferably having from 2 to 10 carbon atoms, such as acetoxy and benzoyloxy), an acylamino group (preferably having from 2 to 30 carbon atoms, more preferably having from 2 to 20 carbon atoms, particularly preferably having from 2 to 10 carbon atoms, such as acetylamino and benzoylamino), an alkoxycarbonylamino group (preferably having from 2 to 20 carbon atoms, more preferably having from 2 to 20 carbon atoms, and particularly preferably having from 2 to 12 carbon atoms, such as methoxycarbonylamino), an aryloxycarbonylamino group (preferably having from 7 to 30 carbon atoms, more preferably having from 7 to 20 carbon atoms, and particularly preferably having from 7 to 12 carbon atoms, such as phenyloxycarbonylamino), a sulfoylamino group (preferably having from 1 to 30 carbon atoms, more preferably having from 1 to 20 carbon atoms, and particularly preferably having from 1 to 12 carbon atoms, such as methanesulfonylamino and benzenesulfonylamino), a sulfamoyl group (preferably having from 0 to 30 carbon atoms, more preferably having from 0 to 20 carbon atoms, and particularly preferably having from 0 to 12 carbon atoms, such as sulfamoyl, methylsulfamoyl, dimethylsulfamoyl and phenylsulfamoyl), a carbamoyl group (preferably having from 1 to 30 carbon atoms, more preferably having from 1 to 20 carbon atoms, and particularly preferably having from 1 to 12 carbon atoms, such as carbamoyl, methylcarbamoyl, diethylcarbamoyl and phenylcarbamoyl), an alkylthio group (preferably having from 1 to 30 carbon atoms, more preferably having from 1 to 20 carbon atoms, and particularly preferably having from 1 to 12 carbon atoms, such as methylthio and ethylthio), an arylthio group (preferably having from 6 to 30 carbon atoms, more preferably having from 6 to 20 carbon atoms, and particularly preferably having from 6 to 12 carbon atoms, such as phenylthio), a heterocyclic thio group (preferably having from 1 to 30 carbon atoms, more preferably having from 1 to 20 carbon atoms, and particularly preferably having from 1 to 12 carbon atoms, such as pyridylthio, 2-benzimidazolylthio, 2-benzoxazolylthio and 2-benzythiazolylthio), a sulfonyl group (preferably having from 1 to 30 carbon atoms, more preferably having from 1 to 20 carbon atoms, and particularly preferably having from 1 to 12 carbon atoms, such as mesyl and tosyl), a sulfinyl group (preferably having from 1 to 30 carbon atoms, more preferably having from 1 to 20 carbon atoms, and particularly preferably having from 1 to 12 carbon atoms, such as methanesulfinyl and benzenesulfinyl), an ureido group (preferably having from 1 to 30 carbon atoms, more preferably having from 1 to 20 carbon atoms, and particularly preferably having from 1 to 12 carbon atoms, such as ureido, methylureido and phenylureido), a phsophamide group (preferably having from 1 to 30 carbon atoms, more preferably having from 1 to 20 carbon atoms, and particularly preferably having from 1 to 12 carbon atoms, such as diethylphosphoamide and phenylphosphoamide), a hydroxyl group, a mercapto group, a halogen atom (such as a fluorine atom, a chlorine atom, a bromine atom and an iodine atom, and more preferably a fluorine atom), a cyano group, a sulfo group, a carboxyl group, a nitro group, a hydroxamic acid group, a sulfino group, a hydrazino group, an imino group, a heterocyclic group (preferably having from 1 to 30 carbon atoms, and more preferably having from 1 to 12 carbon atoms, examples of the hetero atom of which include a nitrogen atom, an oxygen atom and a sulfur atom, such as imidazolyl, pyridyl, quinolyl, furyl, thienyl, piperidyl, morpholino, benzoxazolyl, benzimidazolyl, benzthiazolyl, carbazolyl and azepinyl), a silyl group (preferably having from 3 to 40 carbon atoms, more preferably having from 3 to 30 carbon atoms, and particularly preferably having from 3 to 24 carbon atoms, such as trimethylsilyl and triphenylsilyl), and a silyloxy group (preferably having from 3 to 40 carbon atoms, more preferably having from 3 to 30 carbon atoms, and particularly preferably having from 3 to 24 carbon atoms, such as trimethylsilyloxy and triphenylsilyloxy). These substituents each may be further substituted.

The formula (I) will be described. $Z_1$, $Z_2$, $Z_3$, $Z_4$, $Z_5$, $Z_6$, $Z_7$ and $Z_8$ each independently represents an atom selected from the group consisting of carbon, nitrogen, oxygen, sulfur and silicon. Each of the interatomic bonds in the 5-membered ring including $Z_1$, $Z_2$, $Z_3$, $Z_4$ and a nitrogen atom, and the 5-membered ring including $Z_5$, $Z_6$, $Z_7$, $Z_8$ and a nitrogen atom are not particularly limited and may be any combination of a single bond and a double bond. $Z_1$, $Z_2$, $Z_3$, $Z_4$, $Z_5$, $Z_6$, $Z_7$ and $Z_8$ each preferably represent a carbon atom or a nitrogen atom.

In the formula (I), $Z_1$, $Z_2$, $Z_3$, $Z_4$, $Z_5$, $Z_6$, $Z_7$ and $Z_8$ each may have a substituent selected from the substituent group A where they can be substituted. Preferred examples of the substituent include an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamonyl group, a carbamoyl group, an alkylthio group, an arylthio group, a heterocyclic thio group, a sulfonyl group, a sulfinyl group, an ureido group, a phosphoamide group, a hydroxyl group, a mercapto group, a halogen atom, a cyano group, a sulfo group, a carboxyl group, a nitro group, a sulfino group, a heterocyclic group and a silyl group, and more preferred examples thereof include a substituted or unsubstituted alkyl group, a cycloalkyl group, an aryl group, an amino group, an alkoxy group, an aryloxy group and a heterocyclic group, and further preferably the groups are substituted by an alkyl group, an alkoxy group or an amino group.

In the formula (I), $A_1$ represents a divalent linking group. The divalent linking group is not particularly limited, and is preferably a divalent linking group containing an atom selected from the group consisting of a carbon atom, a nitrogen atom, an oxygen atom, a sulfur atom, a silicon atom, a germanium atom and a phosphorous atom, and more preferably a group selected from the following linking group group A.

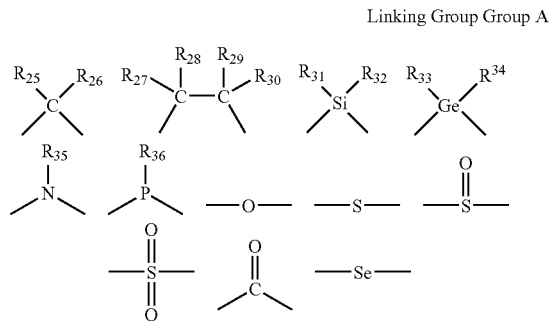

Linking Group Group A

In the linking group group A, $R_{25}$, $R_{26}$, $R_{27}$, $R_{28}$, $R_{29}$, $R_{30}$, $R_{31}$, $R_{32}$, $R_{33}$, $R_{34}$, $R_{35}$ and $R_{36}$ (which are referred to as $R_{25}$ to $R_{36}$) each independently represents a hydrogen atom or a substituent. In the case where $R_{25}$ to $R_{36}$ represent substituents, the substituents each is a substituent selected from the substituent group A. $R_{25}$ to $R_{36}$ each may have a substituent where they can be substituted, $R_{25}$ and $R_{26}$, $R_{27}$ and $R_{28}$, $R_{29}$ and $R_{30}$, $R_{27}$ and $R_{29}$, $R_{27}$ and $R_{30}$, $R_{28}$ and $R_{30}$, $R_{28}$ and $R_{29}$, $R_{31}$ and $R_{32}$, and $R_{33}$ and $R_{34}$ each may be connected to each other to form a ring.

$A_1$ preferably represents a hydrogen atom or a substituent selected from the substituent group A, and among these, —$C(R_{25})(R_{26})$—, —$C(R_{27})(R_{28})C(R_{29})(R_{30})$—, —$Si(R_{31})(R_{32})$—, —$N(R_{35})$—, —O—, —S—, —SO—, —$SO_2$— and —CO— are preferred, —$C(R_{25})(R_{26})$—, —$C(R_{27})(R_{28})C(R_{29})(R_{30})$—, —$Si(R_{31})(R_{32})$—, —$N(R_{35})$—, —O— and —S— are more preferred, and —$C(R_{25})(R_{26})$— and —$C(R_{27})(R_{28})C(R_{29})(R_{30})$— are further preferred.

In the group —$C(R_{25})(R_{26})$—, $R_{25}$ and $R_{26}$ each preferably represents a hydrogen atom or a substituent selected from the following substituent group B.

(Substituent Group B)

The substituent group B includes an alkyl group, a cycloalkyl group, an aryl group, a halogen atom, an amino group, an alkylthio group, an arylthio group, an alkoxy group, an aryloxy group, a hydroxyl group, a mercapto group and a halogen atom, preferably an alkyl group, a cycloalkyl group, an aryl group, a halogen atom, an alkylthio group, an arylthio group, an alkoxy group, an aryloxy group and a halogen atom, and more preferably an alkyl group and an aryl group.

In the group —$C(R_{27})(R_{28})C(R_{29})(R_{30})$—, $R_{27}$, $R_{28}$, $R_{29}$ and $R_{30}$ each preferably represents a hydrogen atom or a substituent selected from the substituent group B.

In the group —$Si(R_{31})(R_{32})$—, $R_{31}$ and $R_{32}$ each preferably represents a hydrogen atom or a substituent selected from the substituent group B.

In the group —$Ge(R_{33})(R_{34})$—, $R_{33}$ and $R_{34}$ each preferably represents a hydrogen atom or a substituent selected from the substituent group B.

In the group —$N(R_{35})$—, $R_{35}$ preferably represents a hydrogen atom, an alkyl group, a cycloalkyl group or an aryl group, more preferably an alkyl group or an aryl group, and further preferably an aryl group.

In the group —$P(R_{36})$—, the preferred range of $R_{36}$ is the same as in $R_{35}$.

In the formula (I), $B_1$ and $B_2$ each independently represents a single bond or a divalent linking group. The divalent linking group is not particularly limited, and is preferably a single bond, or a divalent linking group containing an atom selected from the group consisting of a carbon atom, a nitrogen atom, an oxygen atom, a sulfur atom, a silicon atom, a germanium atom or a phosphorous atom, more preferably a single bond or a group selected from the linking group group A, further preferably a single bond, or —$C(R_{25})(R_{26})$—, —$C(R_{27})(R_{28})C(R_{29})(R_{30})$—, —$Si(R_{31})(R_{32})$—, —$N(R_{35})$—, —O—, —S— or —CO—, and particularly preferably a single bond, or —$C(R_{25})(R_{26})$— or —O—. In the case where $B_1$ represents —$C(R_{25})(R_{26})$—, —$C(R_{27})(R_{28})C(R_{29})(R_{30})$—, —$Si(R_{31})(R_{32})$—, —$Ge(R_{33})(R_{34})$—, —$N(R_{35})$— or —$P(R_{36})$—, the preferred ranges thereof are the same as in $A_1$.

In the formula (I), $X_1$ and $X_2$ each represents a partial structure containing an atom bonded to the platinum atom. The partial structure represented by $X_1$ is preferably a group bonded to the platinum atom through a carbon atom, a group bonded thereto through a nitrogen atom, a group bonded thereto through a silicon atom, a group bonded thereto through a phosphorous atom, a group bonded thereto through an oxygen atom or a group bonded thereto through a sulfur atom, more preferably a group bonded to the platinum atom through a carbon atom, a nitrogen atom, an oxygen atom or a sulfur atom, further preferably a group bonded to the platinum atom through a carbon atom, a sulfur atom, a nitrogen atom or an oxygen atom, and particularly preferably a group bonded to the platinum atom through a carbon atom or an oxygen atom. $X_1$ and $X_2$ are not connected to each other to form a ring.

The group bonded to the platinum atom through a carbon atom is preferably a substituted or unsubstituted aryl group bonded through a carbon atom, a substituted or unsubstituted 5-membered heteroaryl group bonded through a carbon atoms or a substituted or unsubstituted 6-membered heteroaryl group bonded through a carbon atoms, more preferably a substituted or unsubstituted aryl group bonded through a carbon atom, a substituted or unsubstituted 5-membered heteroaryl group bonded through a carbon atoms or a nitrogen-containing 6-membered heteroaryl group bonded through a carbon atoms, and particularly preferably a substituted aryl group bonded through a carbon atom.

The group bonded to the platinum atom through an oxygen atom is preferably a substituted or unsubstituted hydroxyl group, or a substituted or unsubstituted carboxyl group, and more preferably a substituted or unsubstituted carboxyl group.

The group bonded to the platinum atom through a nitrogen atom is preferably a substituted amino group or a nitrogen-containing 5-membered heteroaryl group bonded through a nitrogen atom, more preferably a nitrogen-containing 5-membered heteroaryl group bonded through a nitrogen atom, and particularly preferably a substituted carbazole group, a substituted pyrrole group or a substituted indole group.

The group bonded to the platinum atom through a phosphorous atom is preferably a substituted phosphino group. The group bonded to the platinum atom through a silicon atom is preferably a substituted silyl group, and the group bonded through a sulfur atom is preferably a thiol group or a substituted thiol group.

The formula (I) is preferably the formula (II) or (III). The formula (II) will be described below. In the formula (II), $Z_1$, $Z_2$, $Z_3$, $Z_4$, $Z_5$, $Z_6$, $Z_7$, $Z_8$, $A_1$, $B_1$ and $B_2$ have the same meanings as in the formula (I). $Z_{11}$, $Z_{12}$, $Z_{13}$, $Z_{14}$, $Z_{15}$, $Z_{16}$, $Z_{17}$, $Z_{18}$, $Z_{19}$ and $Z_{20}$ (which are referred to as $Z_{11}$ to $Z_{20}$) each independently represents an atom selected from the group consisting of carbon, nitrogen, oxygen, sulfur and silicon, preferably a carbon atom or a nitrogen atom, and more preferably a carbon atom, and it is further preferred that all $Z_{11}$ to $Z_{20}$ each represents a carbon atom (i.e., an unsubstituted benzene ring). $Z_{11}$ to $Z_{20}$ may have a substituent where they can be substituted. $Y_1$ and $Y_2$ each independently represents an oxygen atom, a sulfur atom, a substituted or unsubstituted nitrogen atom, or a single bond, preferably an oxygen atom or a sulfur atom, and more preferably an oxygen atom. In the case where $Y_1$ and $Y_2$ each represents a substituted nitrogen atom, the substituent thereon is preferably a substituent selected from the substituent group A, more preferably an alkyl group, a cycloalkyl group or an aryl group, and further preferably an alkyl group having from 1 to 7 carbon atoms or an aryl group having from 6 to 12 carbon atoms (number of ring: 1 or 2).

Then, the formula (III) will be described. In the formula (III), $Z_1$, $Z_2$, $Z_3$, $Z_4$, $Z_5$, $Z_6$, $Z_7$, $Z_8$, $A_1$, $B_1$ and $B_2$ have the same meanings as in the formula (I) $Z_{31}$, $Z_{32}$, $Z_{33}$, $Z_{34}$, $Z_{35}$, $Z_{36}$, $Z_{37}$ and $Z_{38}$ (which are referred to as $Z_{31}$ to $Z_{38}$) each independently represents an atom selected from the group consisting of carbon, nitrogen, oxygen, sulfur and silicon, preferably a carbon atom, a nitrogen atom or a sulfur atom, and more preferably a carbon atom or a nitrogen atom. $Z_{31}$ to $Z_{38}$ each may have a substituent where they can be substituted, and examples of the substituent thereon include a substituent selected from the substituent group A. $Y_1$ and $Y_2$ each independently represents an oxygen atom, a sulfur atom, a substituted or unsubstituted nitrogen atom, or a single bond, and have the same meanings as $Y_1$ and $Y_2$ in the formula (II).

The formula (II) is preferably the formula (IIA). The formula (IIA) will be described below. In the formula (IIA), $Z_1$, $Z_2$, $Z_3$, $Z_4$, $Z_5$, $Z_6$, $Z_7$, $Z_8$, $A_1$, $B_1$, $B_2$, $Y_1$ and $Y_2$ have the same meanings as in the formula (II). $R_1$, $R_2$, $R_3$, $R_4$, $R_5$, $R_6$, $R_7$ and $R_8$ (which are referred to as $R_1$ to $R_8$) each independently represents a hydrogen atom or a substituent. Examples of the substituent include a substituent selected from the substituent group A. Preferred examples of $R_1$ to $R_8$ include a hydrogen atom, an alkyl group, a cycloalkyl group, an aryl group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group a sulfinyl group, an ureido group, a phosphoamide group, a hydroxyl group, a mercapto group, a halogen atom, a cyano group, a sulfo group, a carboxyl group, a nitro group, a sulfino group, a heterocyclic group and a silyl group, more preferably a hydrogen atom, an alkyl group, an aryl group, a sulfonyl group, a halogen atom, a cyano group, a nitro group and a heterocyclic group, and most preferably a hydrogen atom, an alkyl group, an aryl group, a halogen atom and a cyano group. $R_1$ to $R_8$ each may have a substituent where they can be substituted. $R_1$ and $R_2$, $R_2$ and $R_3$, $R_3$ and $R_4$, $R_1$ and $R_3$, $R_2$ and $R_4$, $R_1$ and $R_4$, $R_5$ and $R_6$, $R_6$ and $R_7$, $R_7$ and $R_8$, $R_5$ and $R_7$, $R_6$ and $R_8$, and $R_5$ and $R_8$ present on the same benzene ring each may be connected to each other to form a ring. It is preferred that $R_2$ and $R_6$ each represent a hydrogen atom. In case that $Y_1$ or $Y_2$ represents single bond, $R_2$ and $R_6$ each represent a hydrogen atom.

The formula (IIA) is preferably the formula (IIB). The formula (IIB) will be described below. In the formula (IIB), $Z_1$, $Z_2$, $Z_3$, $Z_4$, $Z_5$, $Z_6$, $Z_7$, $Z_8$, $A_1$, $Y_1$, $Y_2$, $R_1$, $R_2$, $R_3$, $R_4$, $R_5$, $R_6$, $R_7$ and $R_8$ have the same meanings as in the formula (IIA).

The formula (IIB) is preferably the formula (IIB1) or (IIB2) The formula (IIB1) will be described below. In the formula (IIB1), $A_1$, $R_1$, $R_2$, $R_3$, $R_4$, $R_5$, $R_6$, $R_7$ and $R_8$ have the same meanings as in the formula (IIB) $R_{11}$, $R_{12}$, $R_{13}$ and $R_{14}$ (which are referred to as $R_{11}$ to $R_{14}$) each independently represents a hydrogen atom or a substituent. Examples of the substituent include a substituent selected from the substituent group A. Preferred examples of $R_{11}$ to $R_{14}$ include a hydrogen atom, an alkyl group, a cycloalkyl group, an aryl group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group a sulfinyl group, an ureido group, a phosphoamide group, a hydroxyl group, a mercapto group, a halogen atom, a cyano group, a sulfo group, a carboxyl group, a nitro group, a sulfino group, a heterocyclic group and a silyl group, more preferably a hydrogen atom, an alkyl group, a cycloalkyl group, an aryl group, a halogen atom and a cyano group, and further preferably a hydrogen atom, an alkyl group and an aryl group. $R_{11}$ to $R_{14}$ each may have a substituent where they can be substituted.

Then, the formula (IIB2) will be described. In the formula (IIB2), $A_1$, $R_1$, $R_2$, $R_3$, $R_4$, $R_5$, $R_6$, $R_7$ and $R_8$ have the same meanings as in the formula (IIB), and $R_{11}$, $R_{12}$, $R_{13}$ and $R_{14}$ have the same meanings as in the formula (IIB1).

The formula (III) is preferably the formula (IIIA) The formula (IIIA) will be described below. In the formula (IIIA), $Z_1$, $Z_2$, $Z_3$, $Z_4$, $Z_5$, $Z_6$, $Z_7$, $A_1$, $Z_{32}$, $Z_{33}$, $Z_{34}$, $Z_{36}$, $Z_{37}$, $Z_{38}$, $Y_1$ and $Y_2$ have the same meanings as in the formula (III).

The compound of the invention may be a low molecular weight compound, an oligomer compound or a polymer compound (the weight average molecular weight (polyethylene standard) of which is preferably 1,000 to 5,000,000, more preferably from 2,000 to 1,000,000, and further preferably from 3,000 to 100,000). In the case of an oligomer compound or a polymer compound, the structure represented by the formulae may be contained in the main chain thereof or may be contained in the side chain thereof. The polymer compound may be a homopolymer compound or may be a copolymer compound. The compound of the invention is preferably a low molecular weight compound.

Specific examples of the compound of the invention are shown below, but the invention is not limited thereto.

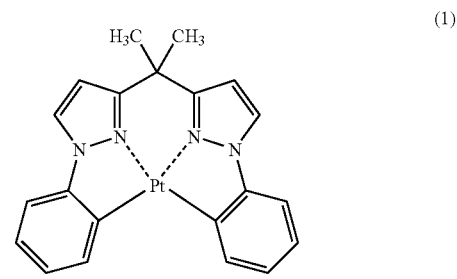

(1)

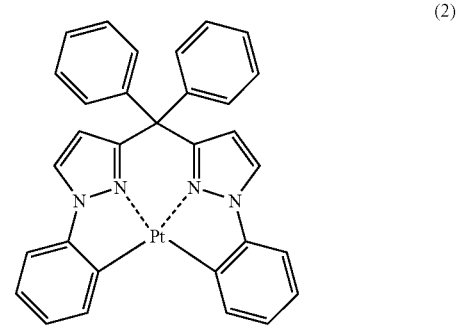

(2)

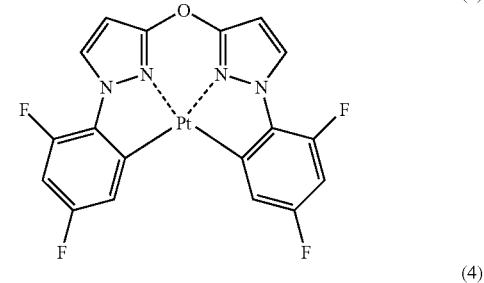

(3)

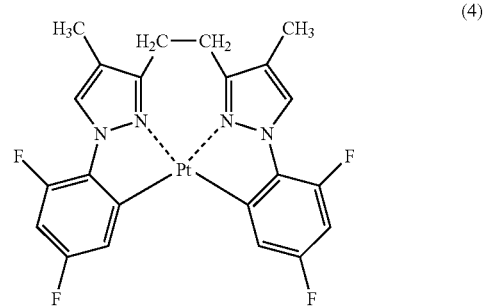

(4)

-continued
(5)
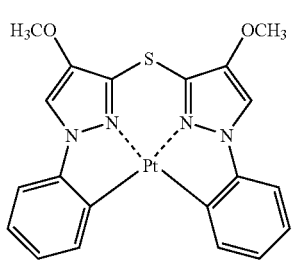
(6)
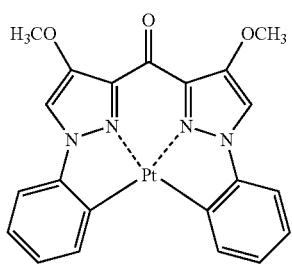
(7)
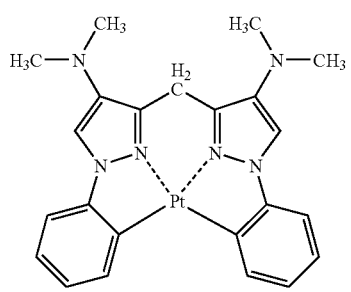
(8)
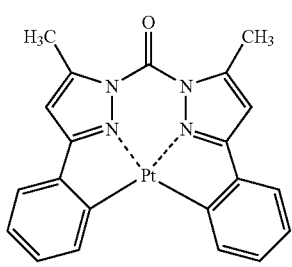
(9)
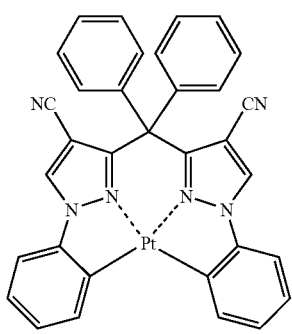
-continued
(10)
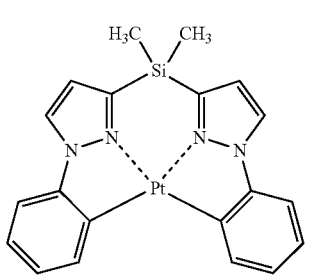
(11)
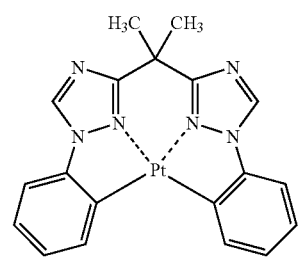
(12)
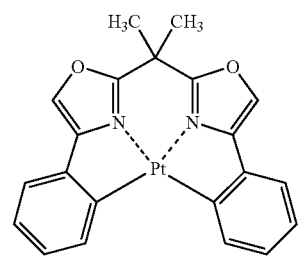
(13)
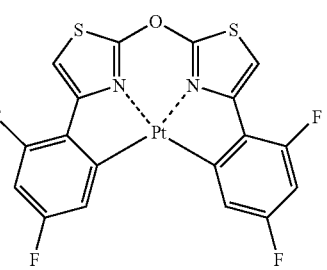
(14)
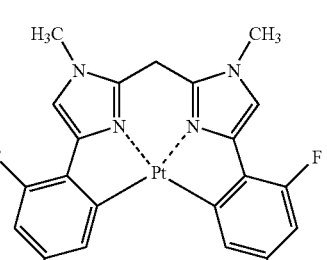
(15)
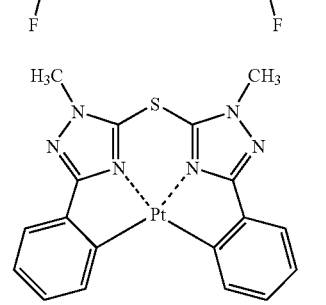

-continued
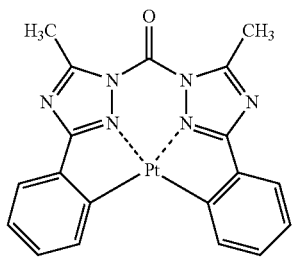
(16)
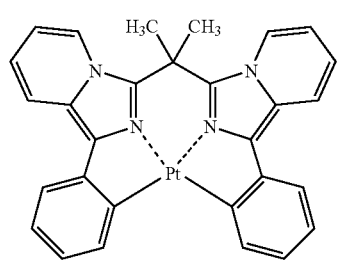
(17)
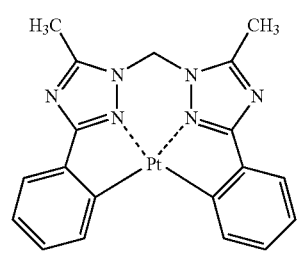
(18)
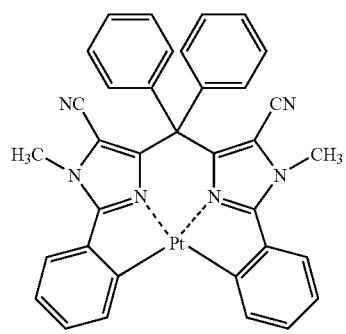
(19)
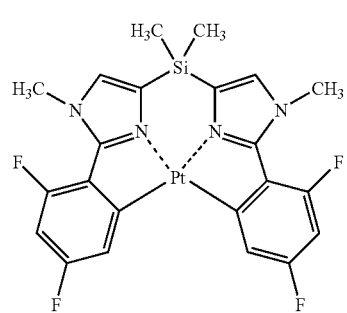
(20)
-continued
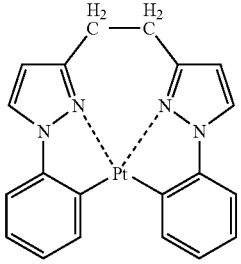
(21)
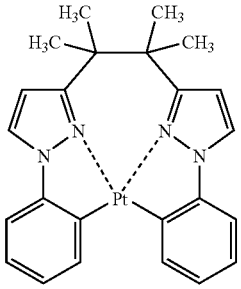
(22)
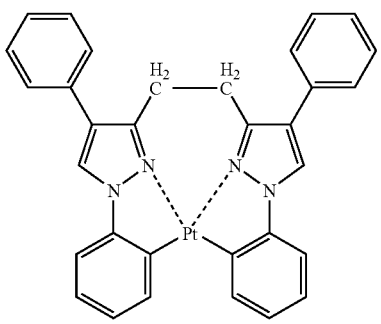
(23)
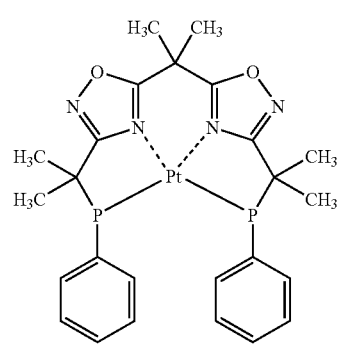
(24)
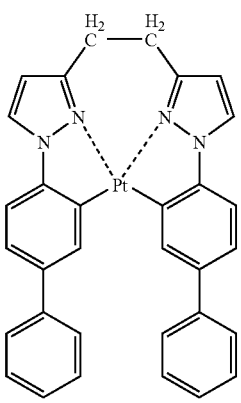
(25)

-continued
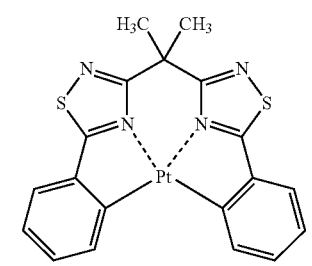
(26)
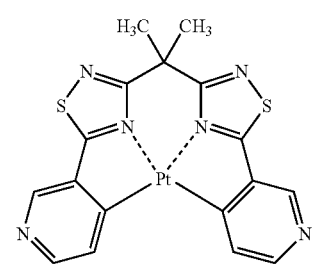
(27)
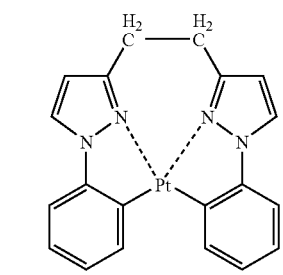
(28)
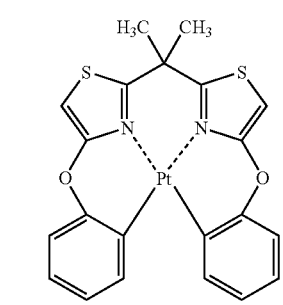
(29)
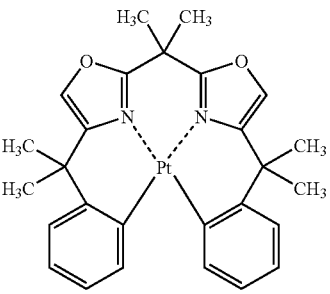
(30)
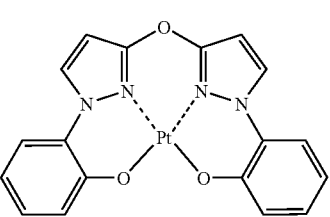
(31)
-continued
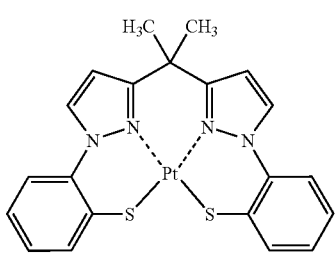
(32)
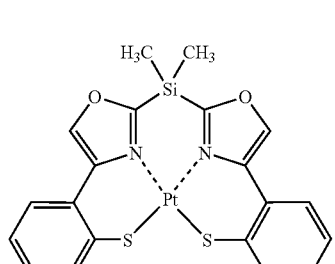
(33)
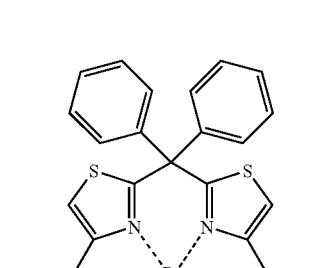
(34)
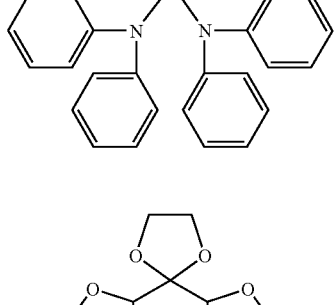
(35)
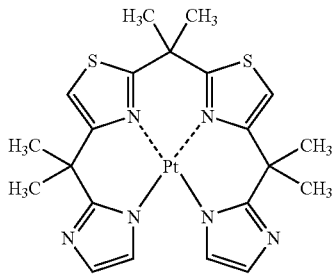
(26)

-continued
(37)
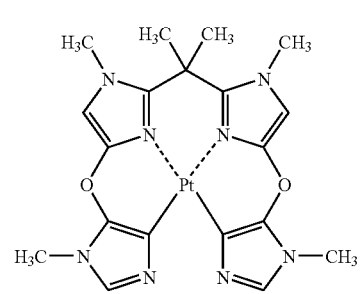
(38)
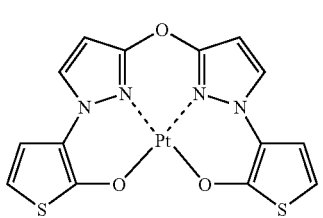
(39)
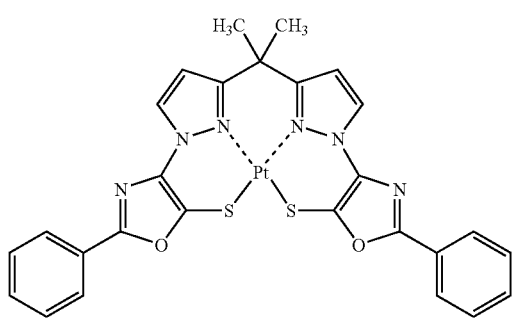
(40)
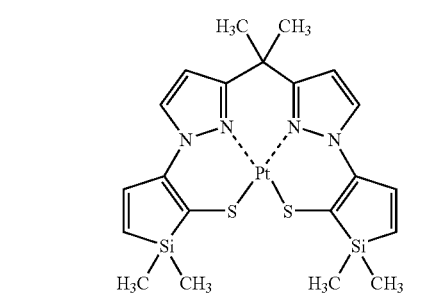
(41)
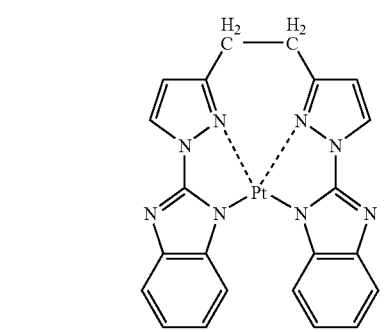
-continued
(42)
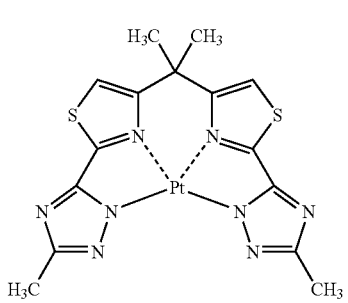
(43)
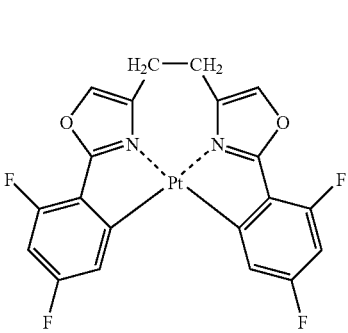
(44)
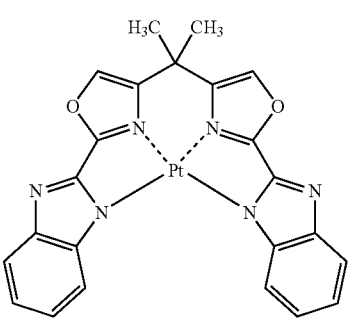
(45)
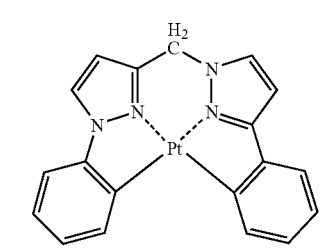
(46)
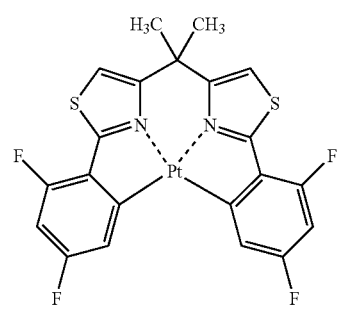

-continued
(47)
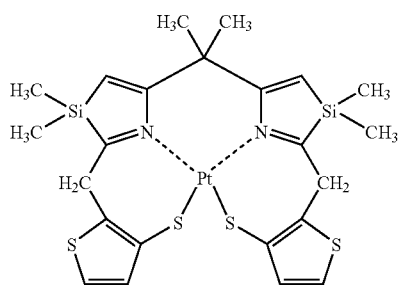
(48)
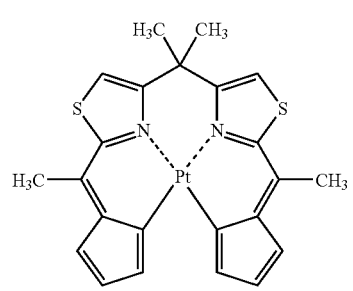
(49)
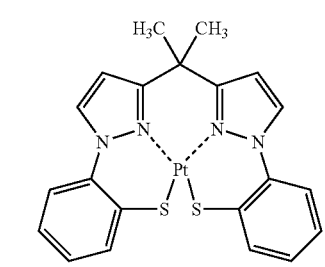
(50)
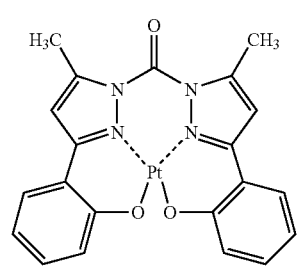
(51)
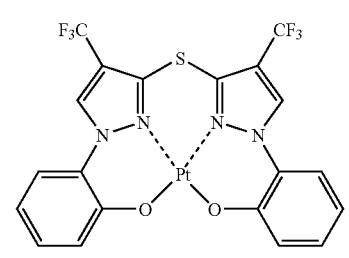
(52)
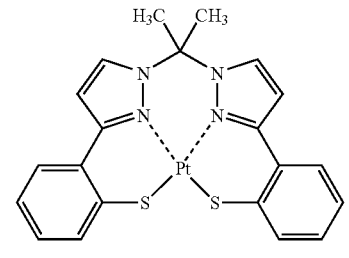
-continued
(53)
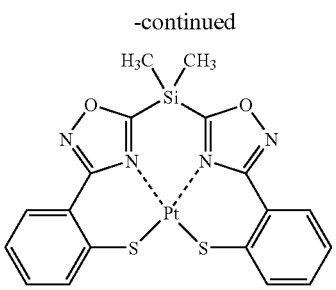
(54)
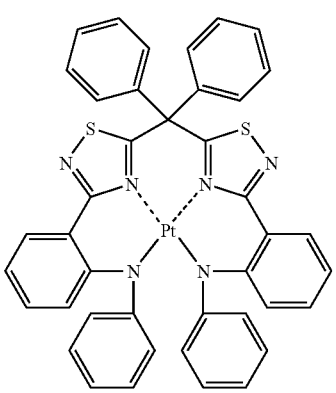
(55)
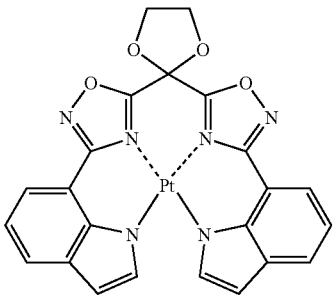
(56)
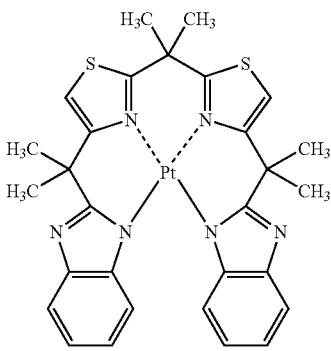
(57)
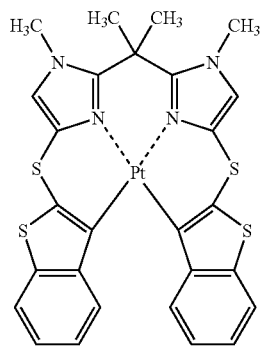

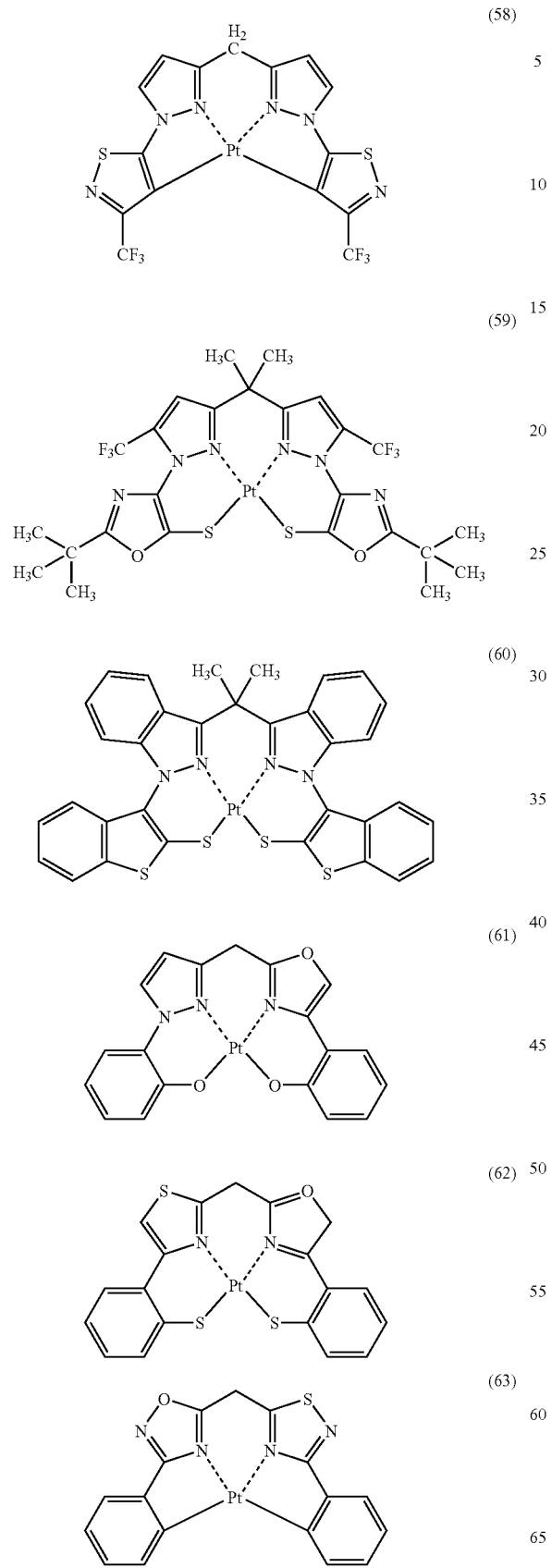
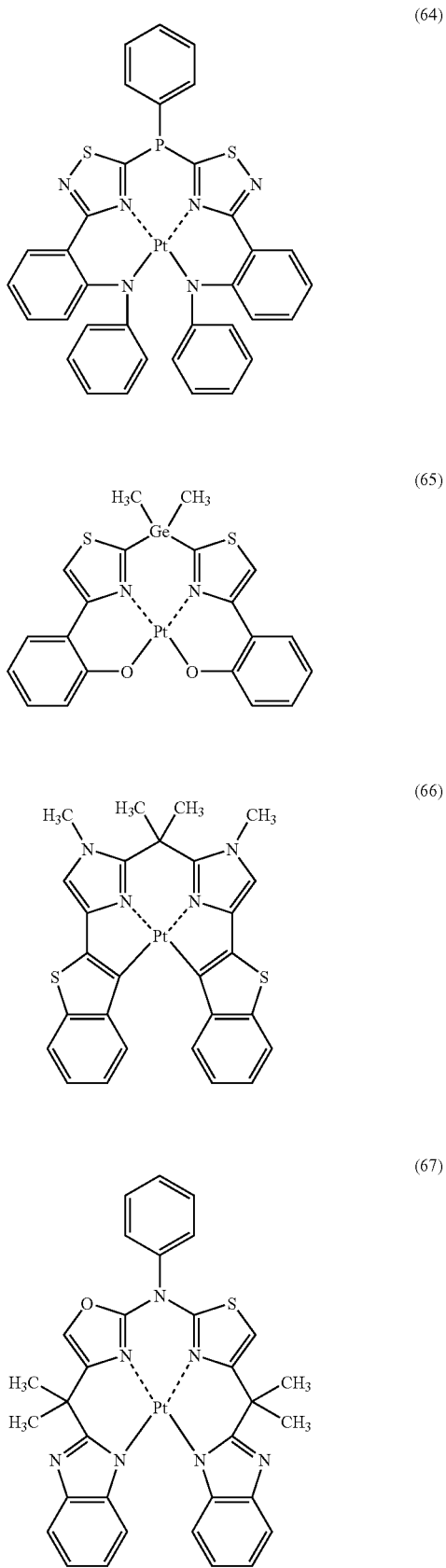

-continued
(68)
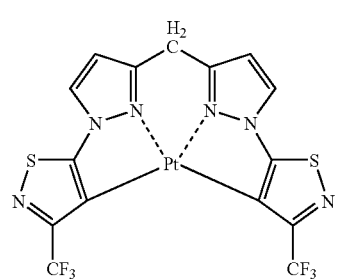
(69)
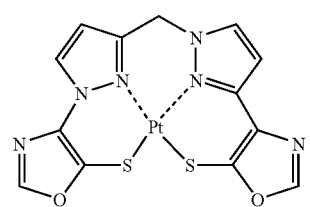
(70)
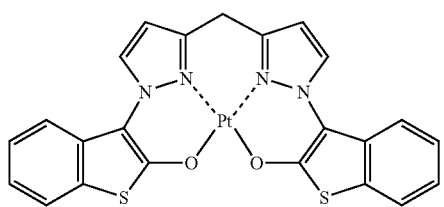
(71)
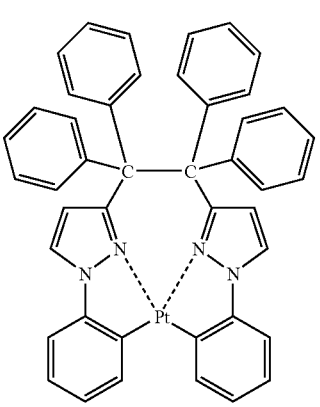
(72)
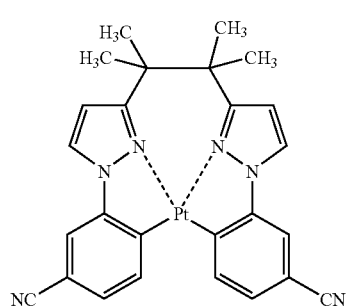
-continued
(73)
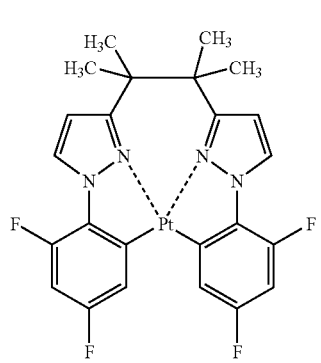
(74)
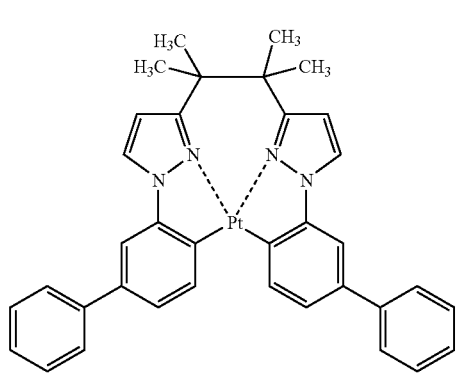
(75)
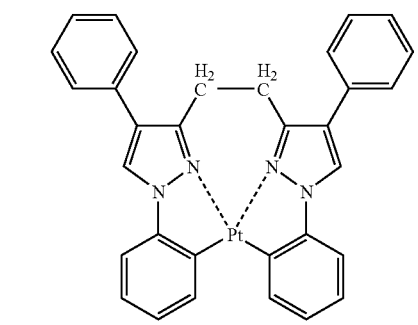
(76)
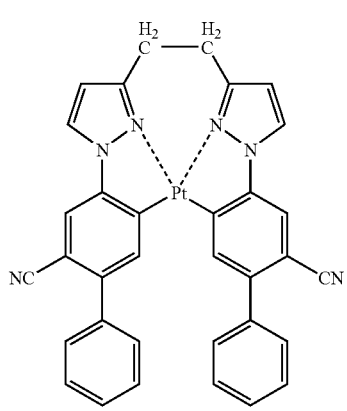

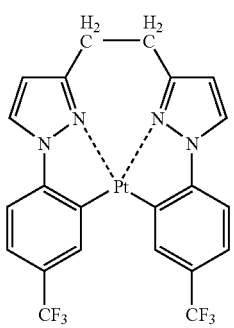 (77)
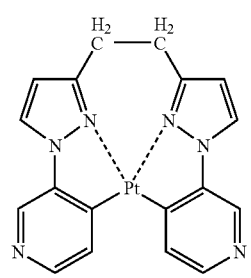 (78)
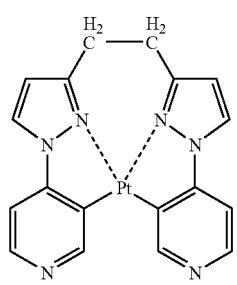 (79)
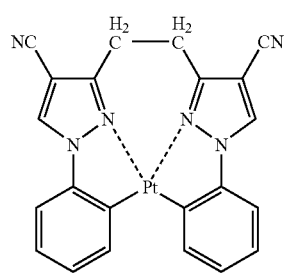 (80)
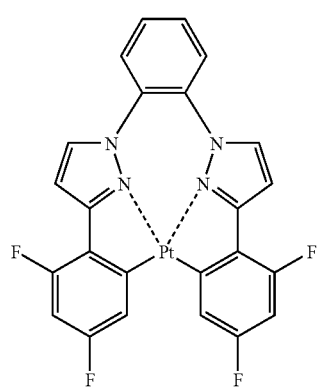 (81)
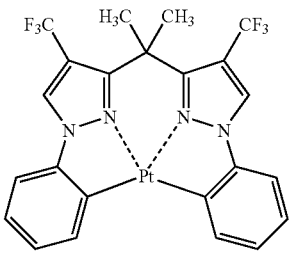 (82)
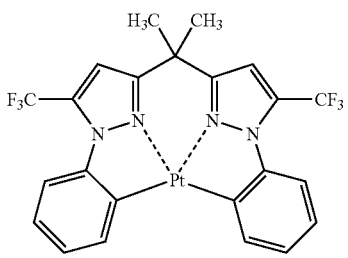 (83)
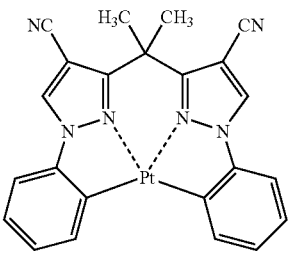 (84)
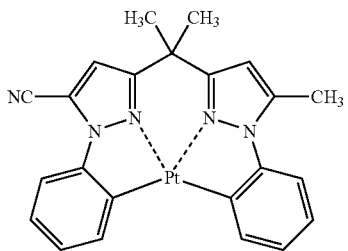 (85)
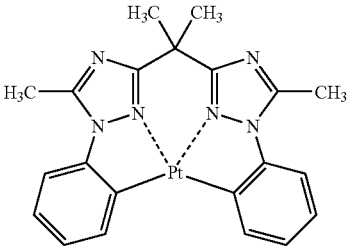 (86)
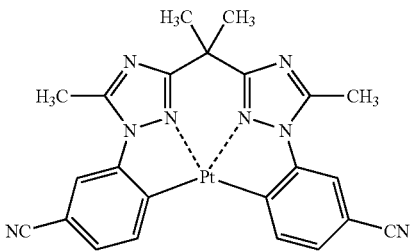 (87)

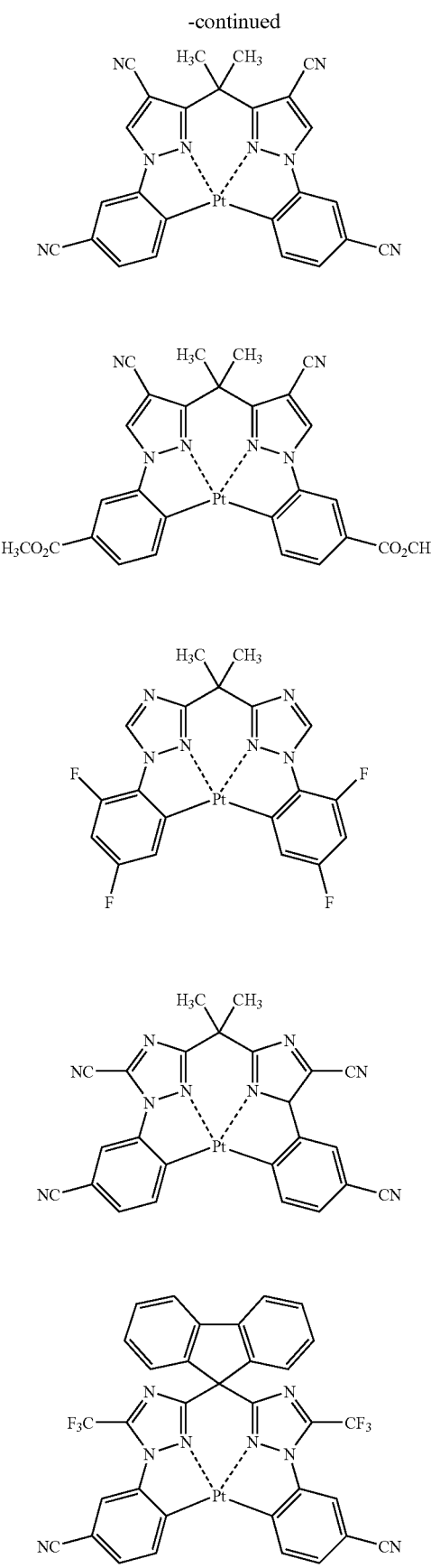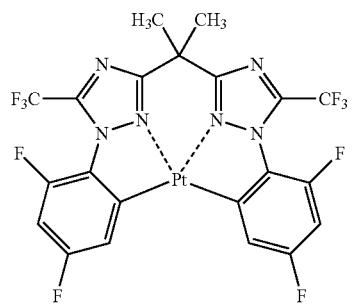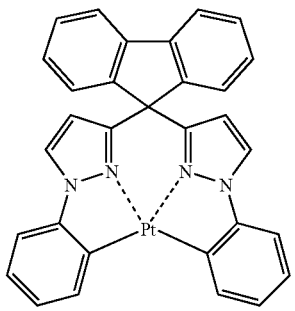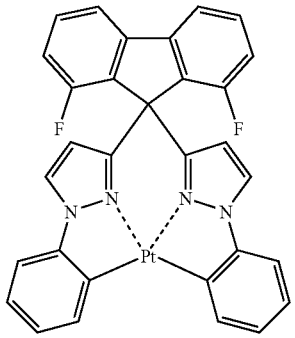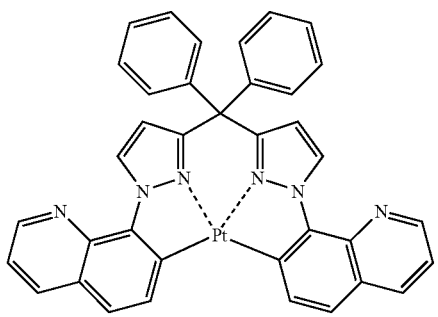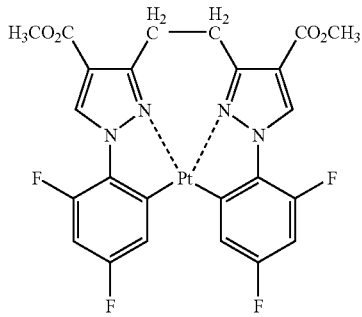

-continued
(98) 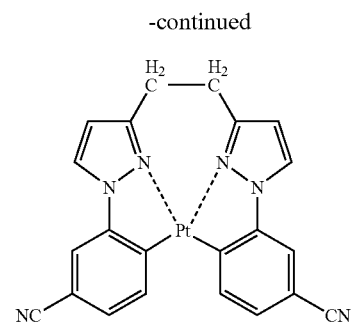
(99) 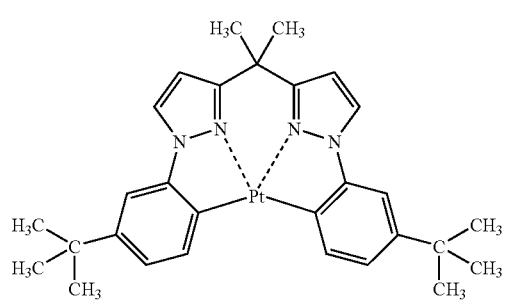
(100) 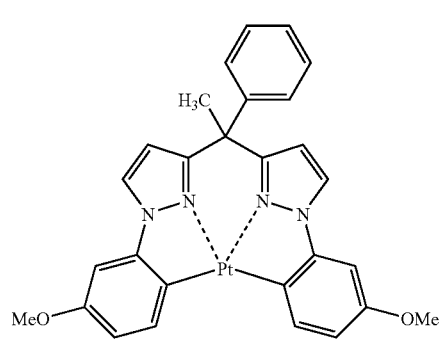
(101) 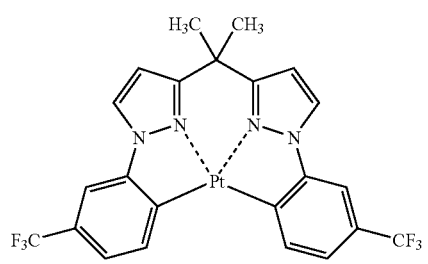
(102) 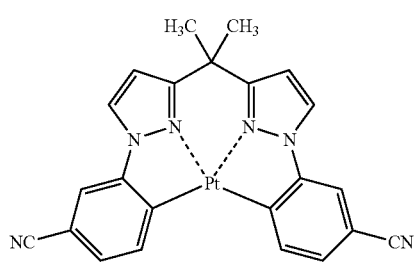
-continued
(103) 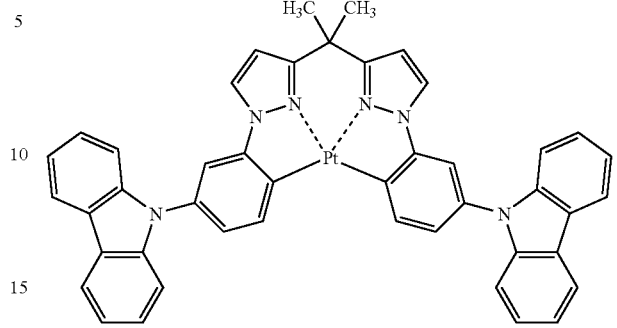
(104) 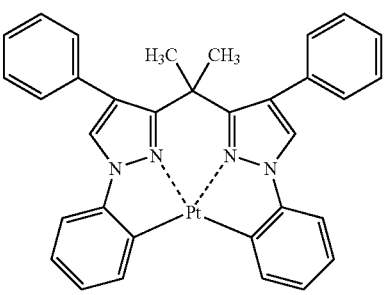
(105) 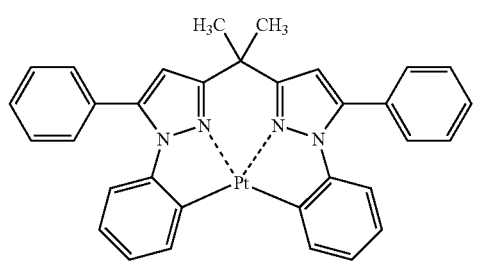
(106) 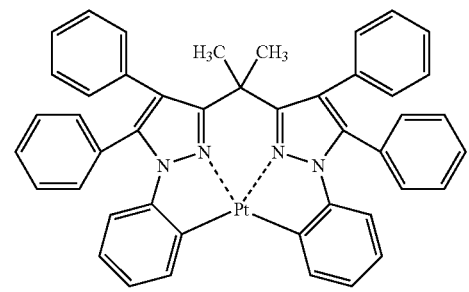
(107) 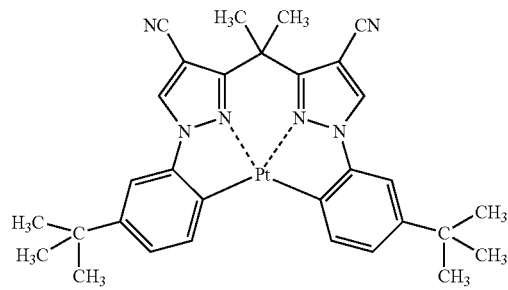

(108)
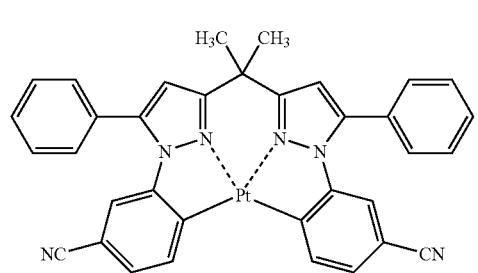
(109)
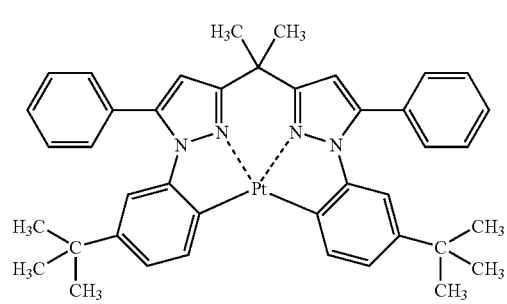
(110)
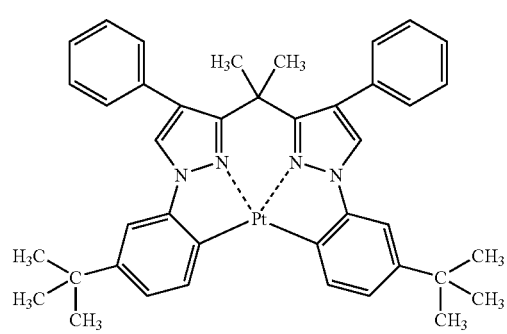
(111)
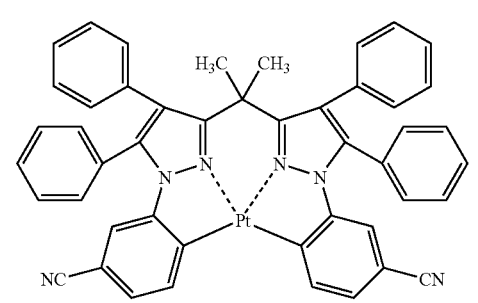
(112)
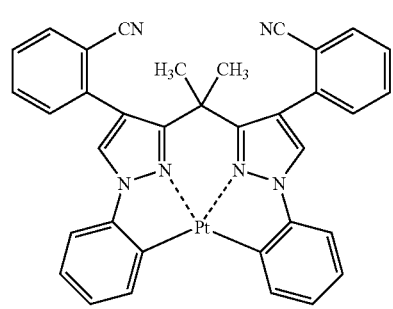
(113)
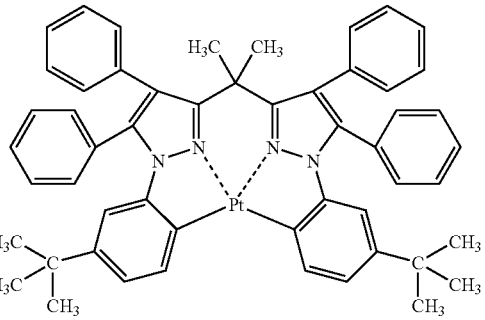
(114)
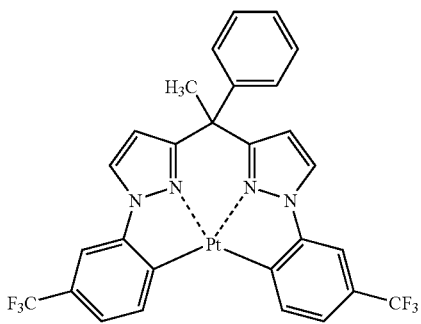
(115)
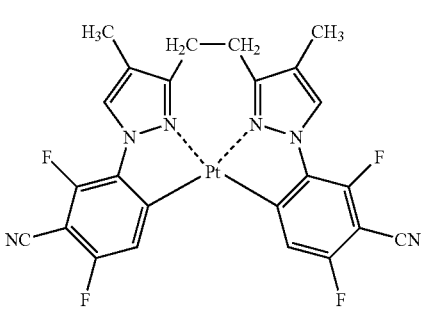
(116)
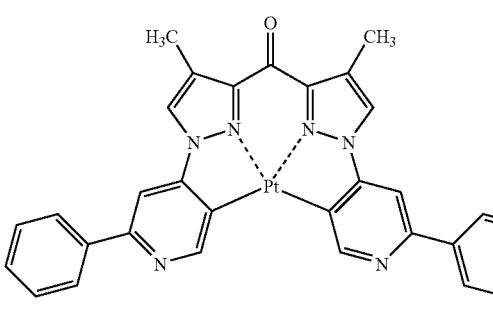
(117)
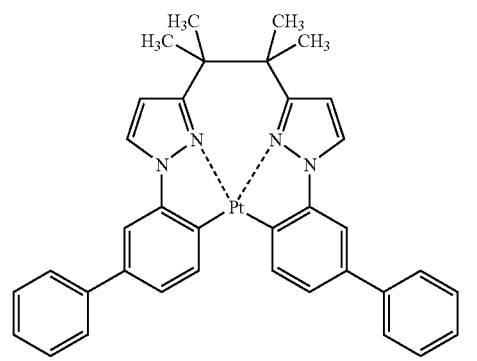

-continued
(118) 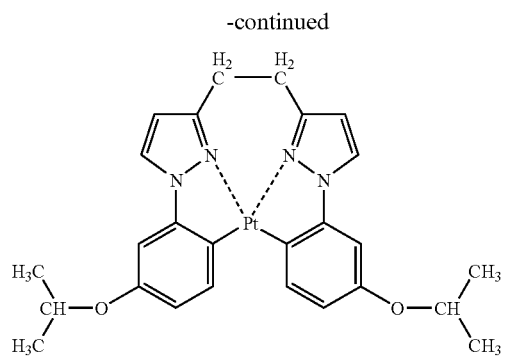
(119) 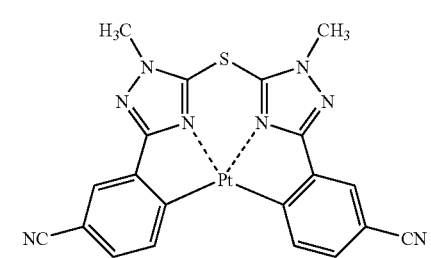
(120) 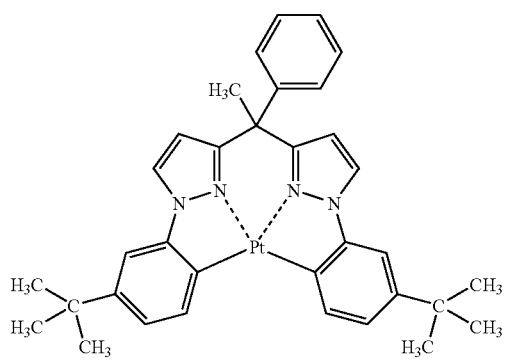
(121) 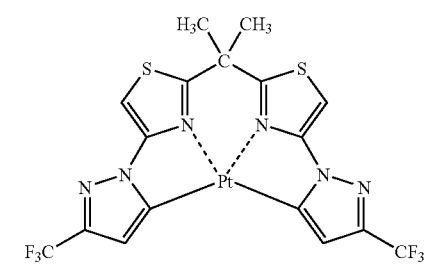
(122) 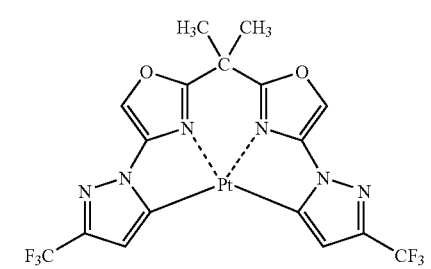
-continued
(123) 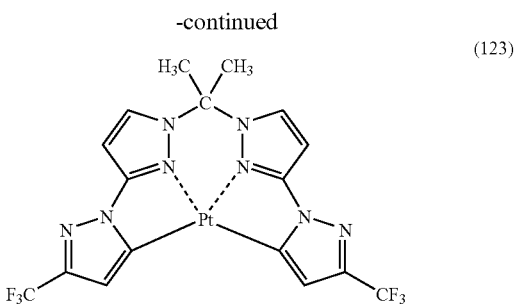
(124) 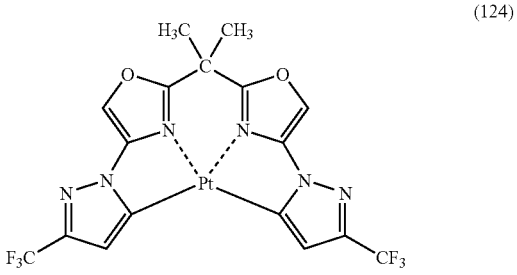
(125) 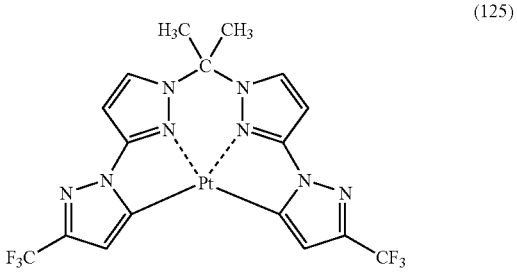
(126) 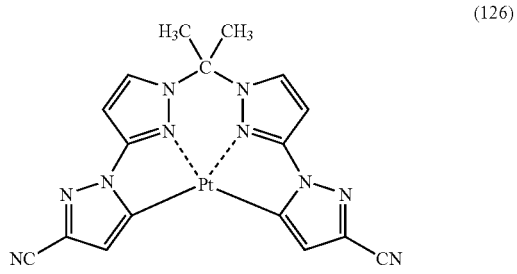
(127) 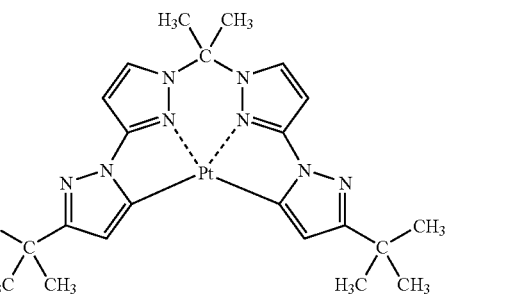

-continued
(128)
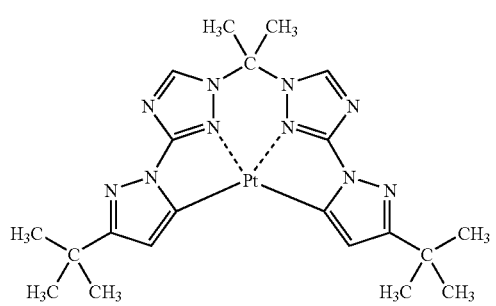
(129)
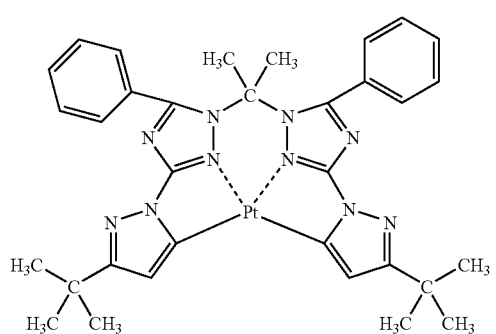
(130)
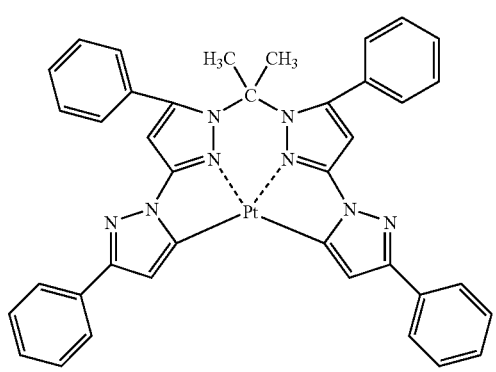
(131)
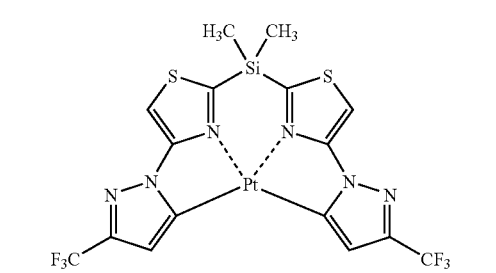
(132)
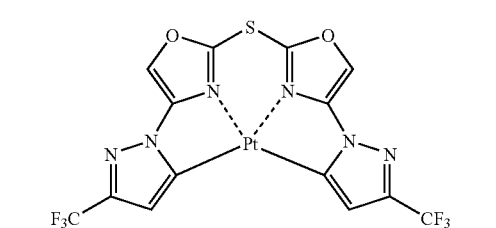
-continued
(133)
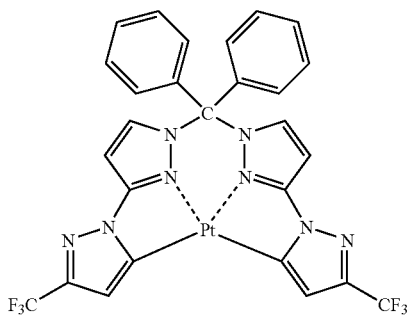
(134)
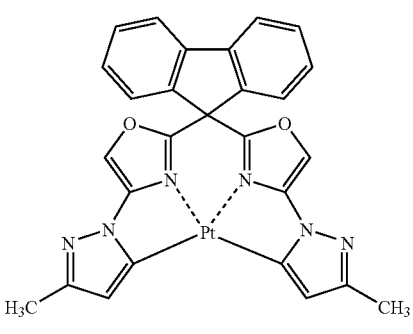
(135)
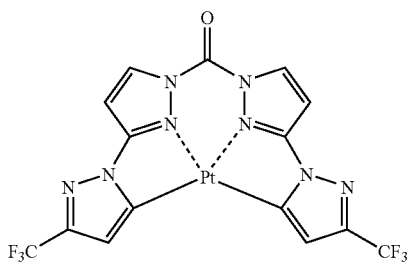
(136)
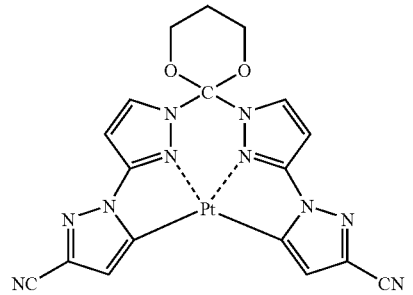
(137)
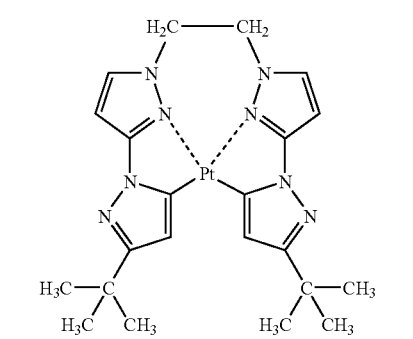

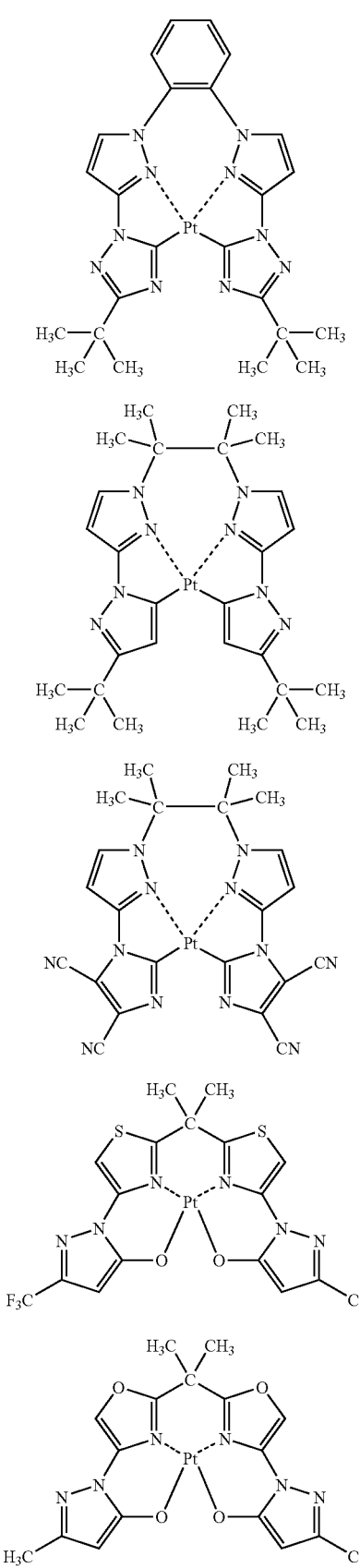
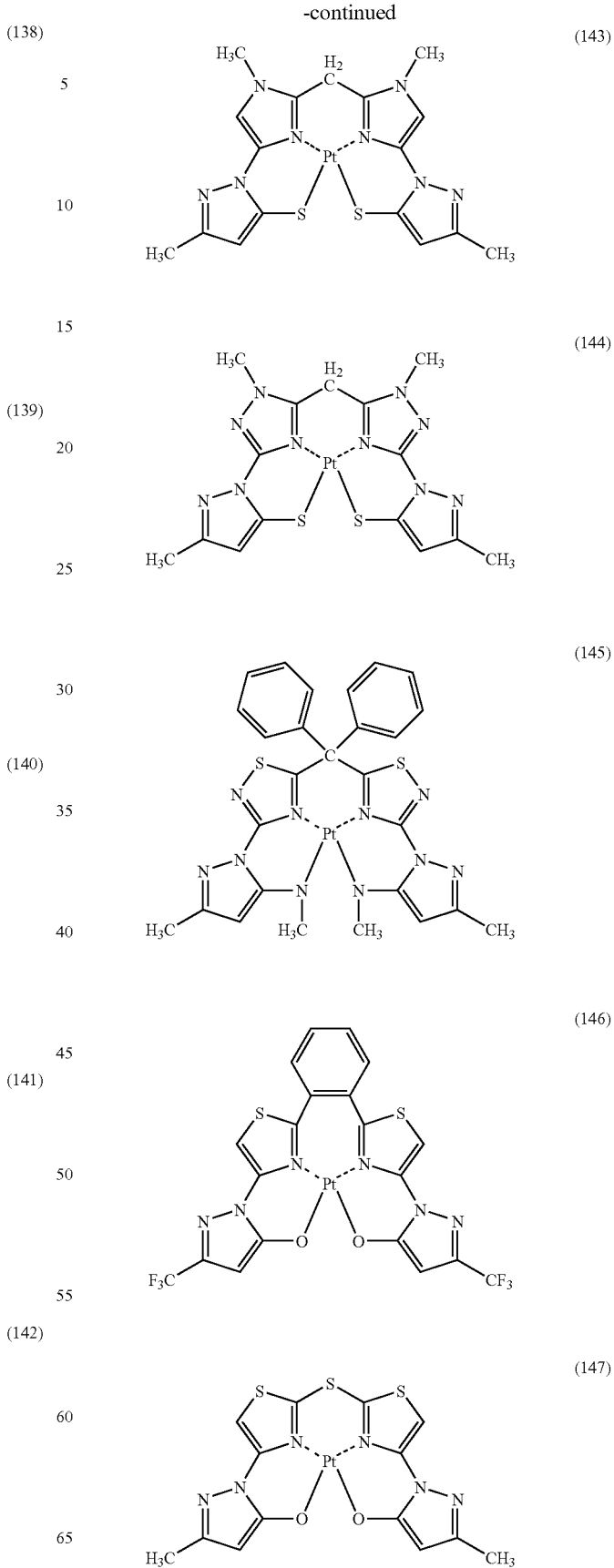

(148)
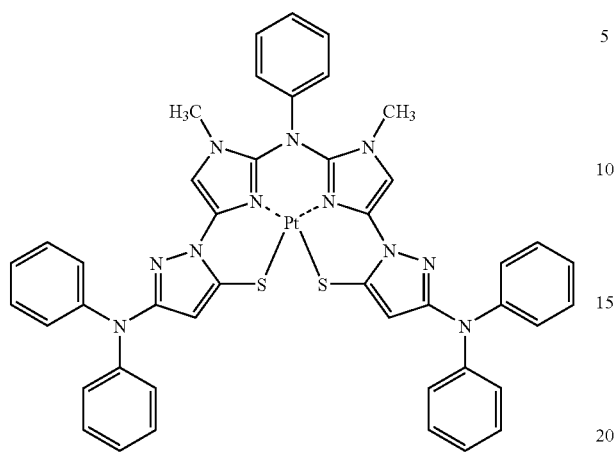
(149)
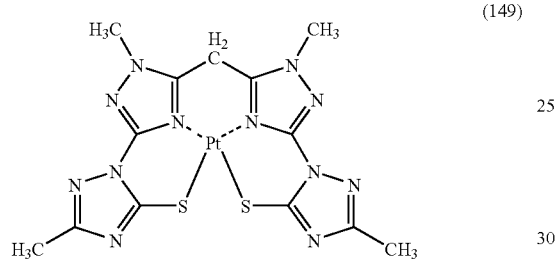
(150)
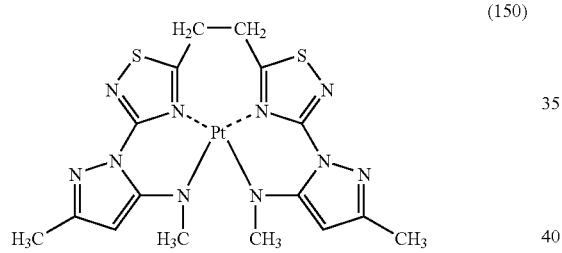
(151)
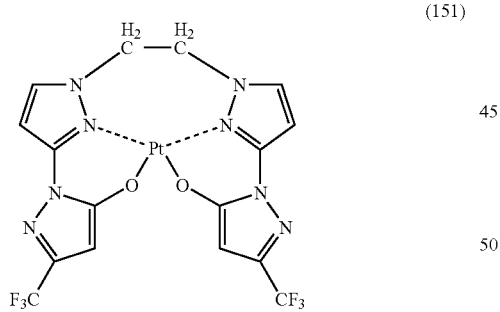
(152)
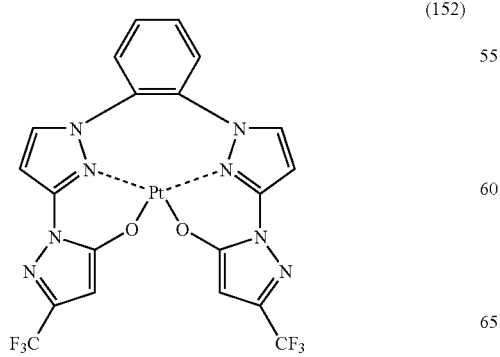
(153)
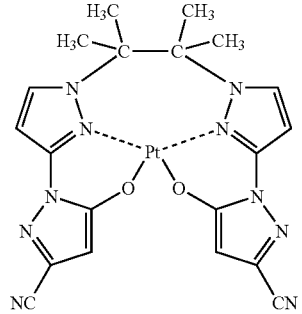
(154)
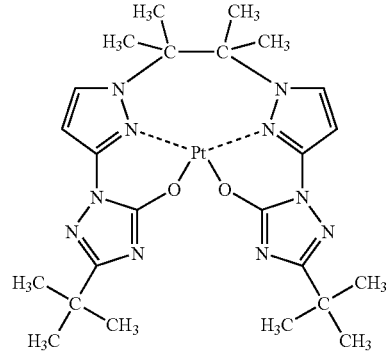
(155)
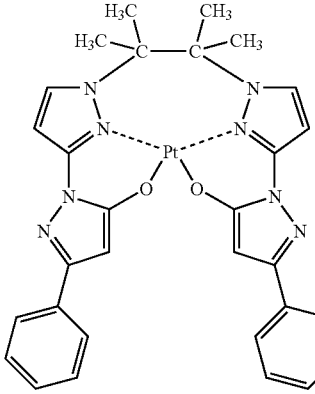
(156)
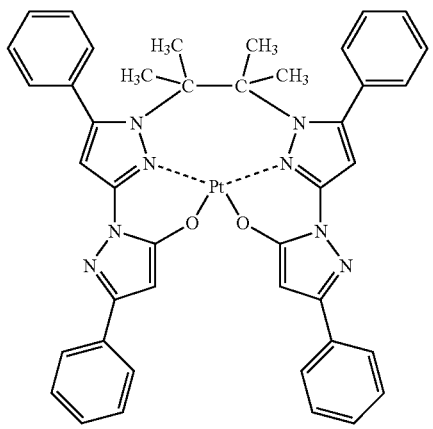

-continued
(157)
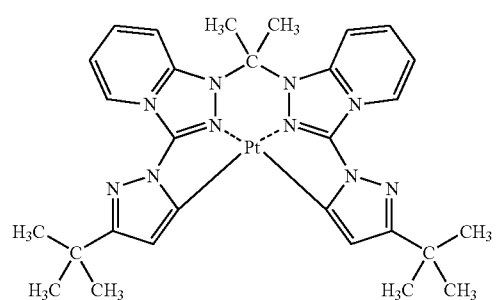
(158)
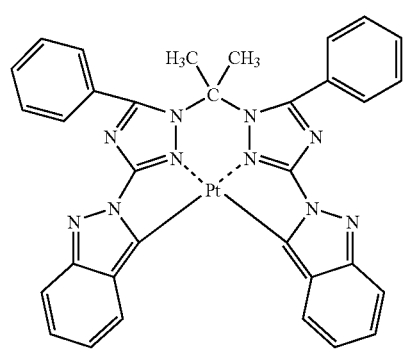
(159)
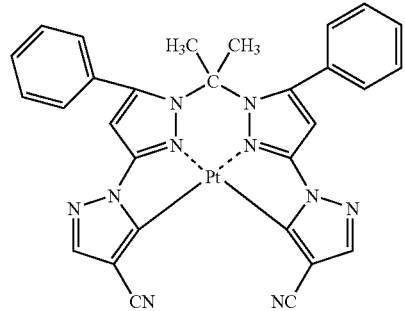
(160)
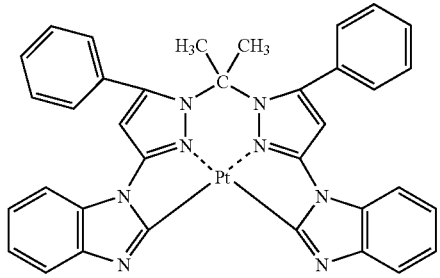
(161)
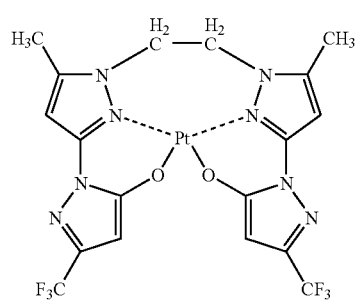
-continued
(162)
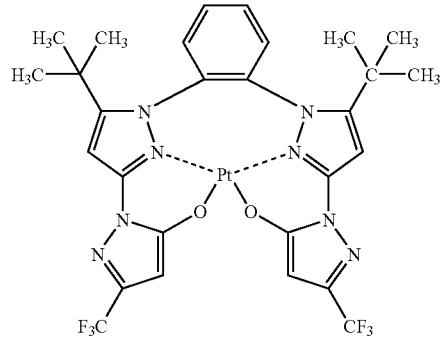
(163)
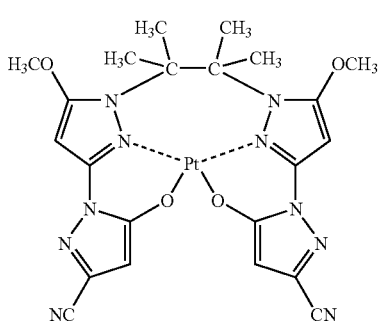
(164)
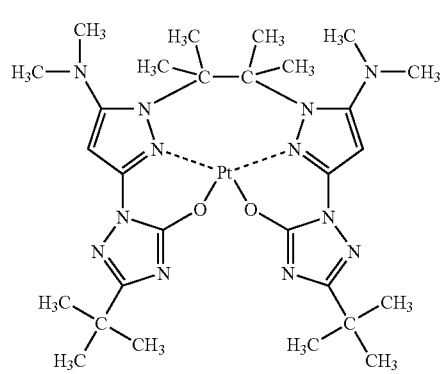
(165)
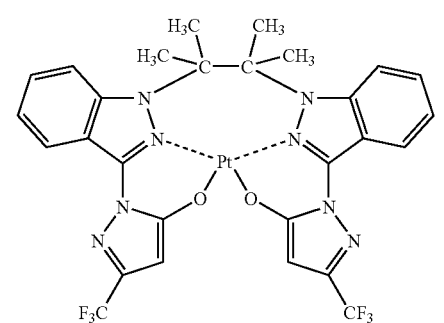

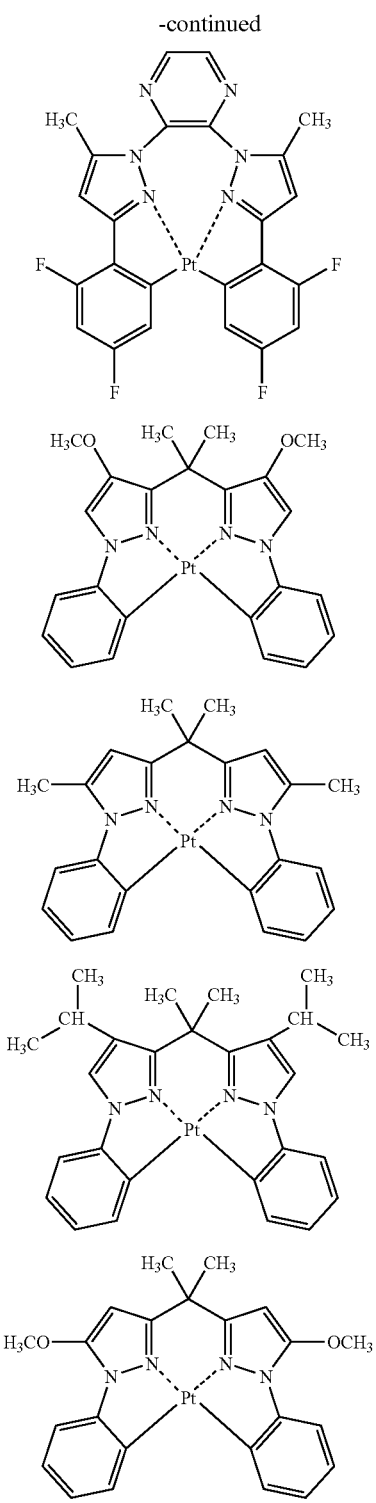

(Synthesis Method of Compound of the Invention)

The compound of the invention can be obtained by various methods. For example, the compound can be obtained from a ligand or a dissociation product thereof and a compound containing a platinum ion in the presence or absence of a solvent (examples of which include a halogen solvent, an alcohol solvent, an ether solvent, an ester solvent, a ketone solvent, a nitrile solvent, an amide solvent, a sulfone solvent, a sulfoxide solvent and water) in the presence or absence of a base (examples of which include various inorganic or organic bases, such as sodium methoxide, t-butoxy potassium, triethylamine and potassium carbonate) at room temperature or under heating (examples of which include, in addition to the ordinary heating method, a method using a mantle heater and a method of heating with microwave).

The compound of the invention can be obtained as follows with reference, for example, to Synthesis, vol. 5, pp. 409-111 (1986). A corresponding dicarbonyl compound is reacted with a hydrazine hydrate to synthesize a phenylpyrazole compound, which is then reacted with an alkyl halide or phosgene to synthesize a corresponding ligand. The resulting organic ligand is reacted with the aforementioned suitable platinum source in the presence of the aforementioned solvent to synthesize the compound of the invention. The invention is not limited to the methods described herein.

The reaction time upon synthesizing the compound of the invention is not particularly limited since it depends on the activity of the reaction, and is preferably from 1 minute to 5 days, more preferably from 5 minutes to 3 days, and more preferably from 10 minutes to 24 hours.

The reaction temperature upon synthesizing the compound of the invention is not particularly limited since it depends on the activity of the reaction, and is preferably from 0 to 300° C., more preferably from 5 to 250° C., and further preferably from 10 to 200° C.

The compound of the invention can be synthesized by adding the ligand having the target complex partial structure formed therein to a platinum compound preferably in an amount of from 0.1 to 10 equivalents, more preferably from 0.3 to 6 equivalents, and further preferably from 0.5 to 4 equivalents. Examples of the platinum compound include a halide (such as platinum chloride and potassium platinate chloride), a carboxylate salt (such as platinum acetate), a diketonate compound (such as platinum acetylacetonate), a platinum compound containing an organic ligand (such as dichlorocyclooctadienyl platinum), and hydrates thereof.

A synthesis example of the exemplified compound (1), (101), (102) and (114) of the compound represented by the formula (I) of the invention is shown below, but the invention is not limited to the method described herein.

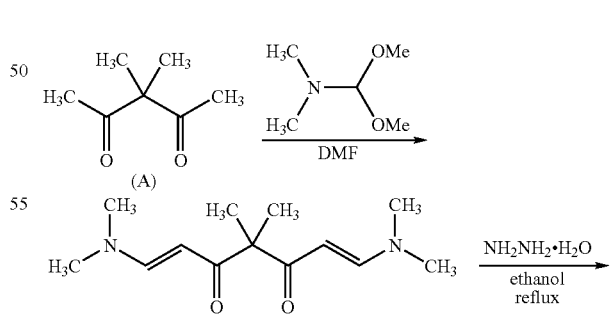

-continued
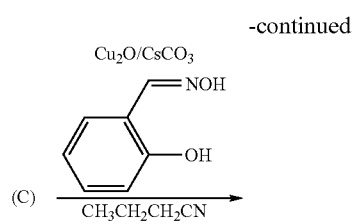
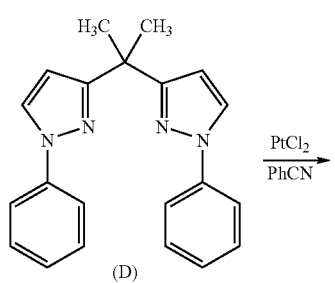
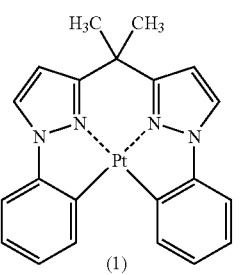
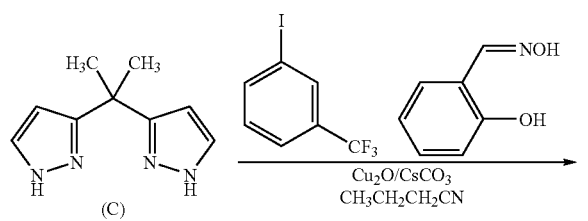
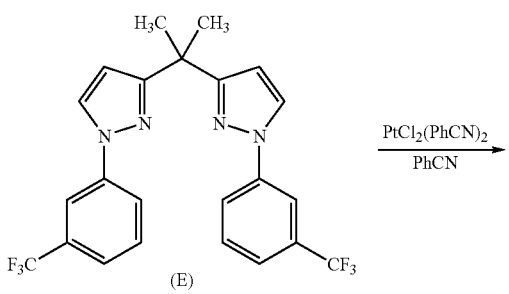
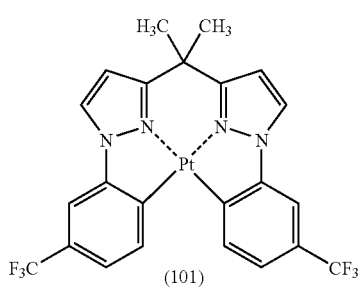
-continued
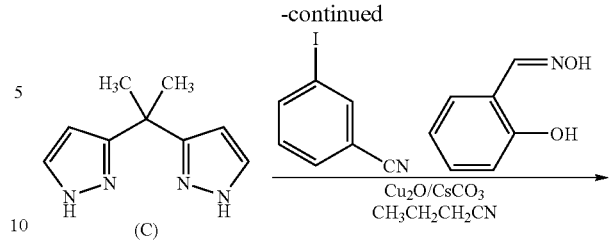
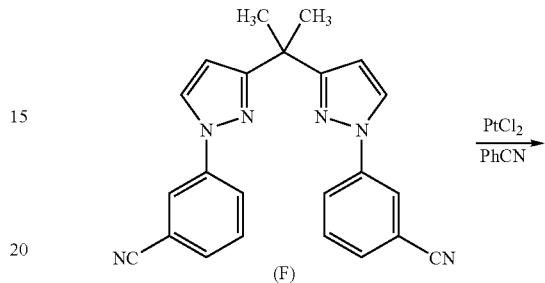
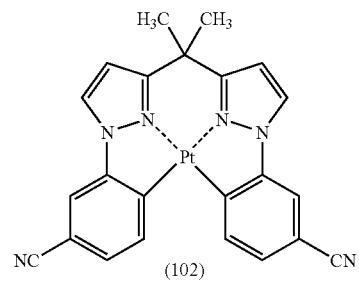
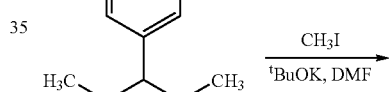
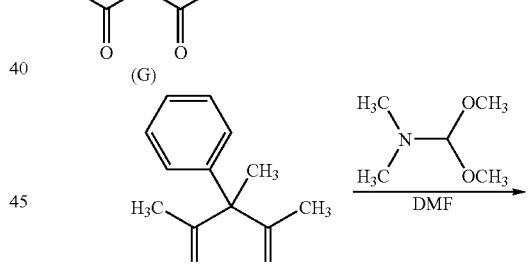
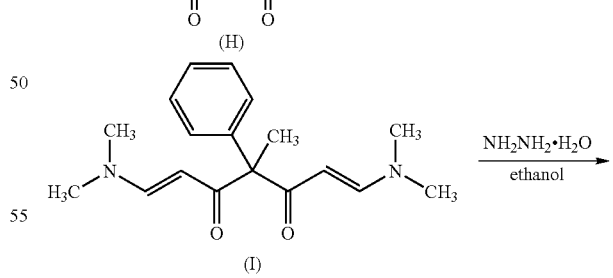
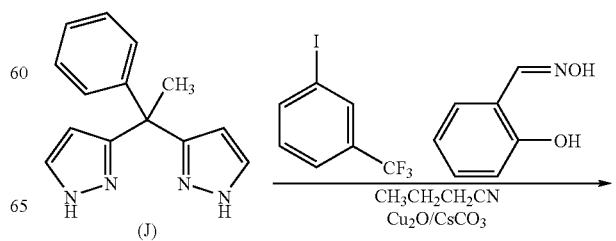

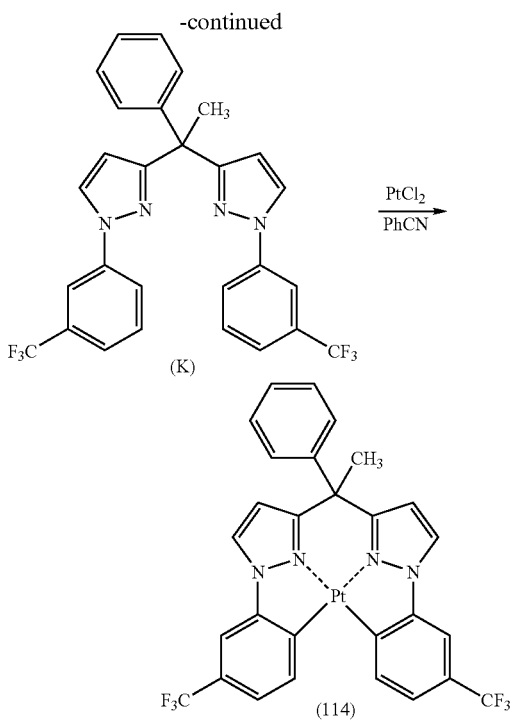

(Synthesis of Compound (1) of the Invention)

10 g (78 mmol) of 3,3-dimethyl-2,4-pentadione (A), 27.6 mL of dimethylformamide-dimethylacetal and 60 mL of dimethylformamide were charged in a 100-mL three-neck flask in a nitrogen atmosphere and reacted for 18 hours at 150° C. The reaction solution was concentrated under reduced pressure, and the residue was purified by silica gel column chromatography (elution solvent: ethyl acetate/methanol=9/1) to obtain 4.83 g of the compound (B) at a yield of 26%.

$^1$H-NMR (400 MHz in CDCl$_3$): δ (ppm)=7.57 (d, J=12.6 Hz, 2H), 5.05 (d, J=12.6 Hz, 2H), 3.01 (broad s, 6H), 2.78 (broad s, 6H), 1.32 (s, 6H)

2.70 g (21.0 mmol) of the compound (B), 1.19 g (23.8 mmol) of hydrazine monohydrate and 200 mL of ethanol were charged in a 300-mL three-neck flask in a nitrogen atmosphere and refluxed under heating for 7 hours. The reaction solution was concentrated, and the residue was purified by silica gel column chromatography (elution solvent: ethyl acetate/ethanol=8/2) to obtain 1.77 g of the compound (C) at a yield of 89%.

$^1$H-NMR (400 MHz in CDCl$_3$): δ (ppm)=7.49 (d, J=2.1 Hz, 2H), 6.19 (d, J=2.1 Hz, 2H), 1.74 (s, 6H)

1.00 g (4.20 mmol) of the compound (C), 11.57 g (56.4 mmol) of iodobenzene, 81.1 mg (0.567 mmol) of copper oxide, 311 mg (2.27 mmol) of salicylaldoxime, 7.39 g (38.3 mmol) of cesium carbonate and 100 mL of butyronitrile were charged in a 200-mL three-neck flask in a nitrogen atmosphere and reacted at 140° C. for 6 hours. The reaction solution was filtered and concentrated. The resulting residue was purified by silica gel column chromatography (elution solvent: hexane/ethyl acetate=10/1) to obtain 1.43 g of the compound (D) at a yield of 77%.

$^1$H-NMR (400 MHz in CDCl$_3$): δ (ppm)=7.80 (d, J=2.7 Hz, 2H), 7.71-7.68 (m, 4H), 7.45-7.39 (m, 4H), 7.25-7.20 (m, 2H), 6.32 (d, J=2.4 Hz, 2H), 1.85 (s, 6H)

50 mg (0.152 mmol) of the compound (D), 40.5 mg (0.152 mmol) of platinum chloride and 3 mL of benzonitrile were charged in a 50-mL recovery flask in a nitrogen atmosphere and heated to 200° C. for 5 hours. After cooling to room temperature, 40 mL of hexane was added to the reaction solution, and brown solid thus deposited was purified by silica gel column chromatography (elution solvent: chloroform) to obtain 17.6 mg of the exemplified compound (1) of the invention at a yield of 22%. The compound (1) of the invention emitted light at 460 nm in a dichloromethane solution at room temperature.

$^1$H-NMR (400 MHz in CDCl$_3$): δ (ppm)=8.15 (dd, J=1.2, 7.2 Hz, $^3J_{Pt-H}$=56.8 Hz, 2H), 7.95 (d, J=2.8 Hz, 2H), 7.33 (dd, J=1.2, 7.6 Hz, 2H), 7.24-7.14 (m, 4H), 6.59 (d, J=2.4 Hz, 2H), 1.80 (s, 6H)

(Synthesis of the Exemplified Compound (101) of the Invention)

A 200 ml three-neck flask was charged with 0.30 g (1.70 mmol) of the compound (C), 4.63 g (17.0 mmol) of 3-iodobenzo-trifluoride, 24 mg (0.17 mmol) of copper oxide, 93 mg (0.11 mmol) of salicylaldoxime, 2.21 g (11.5 mmol) of cesium carbonate, and 20 ml of butyronitrile in a nitrogen atmosphere, and the mixture was allowed to react at 140° C. for 18 hours. After completion of the reaction, the reaction solution was filtered and concentrated. The obtained residue was purified with silica gel column chromatography (elution solvent: hexane/ethyl acetate=5/1) to obtain 635 mg of a compound (E) at a yield of 80%.

$^1$H-NMR (400 MHz in CDCl$_3$): δ (ppm)=7.97 (brs, 2H), 7.90-7.84 (m, 4H), 7.58-7.46 (m, 4H), 6.37 (d, J=2.4 Hz, 2H), 1.85 (s, 6H).

A 50 ml recovery flask was charged with 50 mg (0.11 mmol) of the compound (E), 50.5 mg (0.11 mmol) of platinum(II) chloride benzonitrile complex, and 3 ml of benzonitrile in a nitrogen atmosphere, and the mixture was heated at 200° C. for 9 hours. After the temperature was lowered to room temperature, the reaction solution was concentrated under reduced pressure, and the residue was purified with silica gel column chromatography (elution solvent: chloroform). The crude crystal obtained was recrystallized from methanol to obtain 4 mg of the compound (101) of the invention as white powder at a yield of 5.6%. The exemplified compound (101) of the invention emitted weak light at 453 nm in a dichloromethane solution at room temperature.

$^1$H-NMR (400 MHz in CDCl$_3$): δ (ppm)=8.20 (d, J=8.0 Hz, $^3J_{Pt-H}$=54.8 Hz, 2H), 8.04 (d, J=2.8 Hz, 2H), 7.55-7.23 (m, 4H), 6.68 (d, J=2.4 Hz, 2H), 1.80 (s, 6H).

(Synthesis of the Exemplified Compound (102) of the Invention)

Under nitrogen current, 1.0 g (5.7 mmol) of the compound (C), 12.8 g (55.9 mmol) of m-iodobenzonitrile, 80 mg (0.56 mmol) of cuprous oxide, 0.30 g (2.2 mmol) of salicylaldoxime, and 7.16 g (37.1 mmol) of cesium carbonate were suspended in 100 ml of n-butyronitrile, and refluxed with stirring. After stirring the reaction solution with heating for 17.5 hours, the temperature was lowered to room temperature. An insoluble portion was filtered out with Celite, and the solvent in the filtrate was removed. The resulted product was purified with silica gel column chromatography (elution solvent: hexane/ethyl acetate=4/1) to obtain 1.6 g of a compound (F) as crystals at a yield of 75%).

$^1$H-NMR (400 MHz in CDCl$_3$) 400 MHz: δ 1.84 (s, 6H), 6.39 (d, J=2.4 Hz, 2H), 7.48-7.56 (m, 4H), 7.84 (d, J=2.8 Hz, 2H), 7.91 (dt, J=2.0 and 7.6 Hz, 2H), 8.05 (br, 2H).

A 50 ml recovery flask was charged with 50 mg (0.13 mmol) of the compound (F), 35.1 mg (0.13 mmol) of platinum chloride and 3 ml of benzonitrile in a nitrogen atmosphere, and the mixture was heated at 200° C. for 5 hours.

After the temperature was lowered to room temperature, 40 ml of hexane was added to the reaction solution, and the precipitated brown solids were purified with silica gel column chromatography (elution solvent: methylene chloride→methylene chloride/methanol=10/1) to obtain 10.1 mg of the compound (102) of the invention as white powder at a yield of 18%. The exemplified compound (102) of the invention emitted weak light at 460 nm in a dichloromethane solution at room temperature.

$^1$H-NMR (400 MHz in CDCl$_3$): δ (ppm)=8.18 (d, J=7.6 Hz, $^3J_{Pt-H}$=56.8 Hz, 2H), 8.03 (d, J=2.8 Hz, 2H), 7.55 (d, J=1.6 Hz, 2H), 7.49 (dd, J=1.6, 7.6 Hz, 4H), 6.71 (d, J=2.8 Hz, 2H), 1.84 (s, 6H).

(Synthesis of Exemplified Compound (114) of the Invention)

A 500 ml three-neck flask was charged with 20.0 g (114 mmol) of 3-phenyl-2,4-pentanedione (available from Tokyo Kasei Kogyo Co., Ltd.) and 200 ml of dimethylformamide in a nitrogen atmosphere, and the inner temperature was cooled to 5° C. with an ice bath. In the range of inner temperature of from 5 to 15° C., 19.1 g (8.91 mmol) of tert-butoxy potassium was added thereto little by little, and the temperature was restored to room temperature, and followed by stirring for 1 hour. The reaction solution was cooled again, and 14.1 ml (226 mmol) of iodomethane was dropwise added in the inner temperature range of from 5 to 10° C. After the temperature was raised to room temperature, stirring was continued at 80° C. for 6 hours. The reaction mixture was dripped into a hydrochloric acid aqueous solution (prepared by 17 g of a 35% hydrochloric acid aqueous solution and 400 ml of water), extracted with 500 ml of ethyl acetate, the organic layer was washed with 500 ml of saturated brine two times, dried over sodium sulfuric anhydride, filtered and concentrated again. The obtained residue was purified with silica gel column chromatography (elution solvent: hexane/ethyl acetate=10/1) to obtain 11.1 g of a compound H at a yield of 51%.

$^1$H-NMR (CDCl$_3$): δ (ppm)=7.50-7.20 (m, 5H), 2.12 (s, 6H), 1.77 (s, 3H).

A 100 ml three-neck flask was charged with 5.00 g (26.3 mmol) of a compound (H), 8.9 ml of dimethylformamide-dimethyl acetal, and 30 ml of dimethylformamide in a nitrogen atmosphere, and the mixture was allowed to react at 150° C. for 14 hours. After the reaction solution was concentrated under reduced pressure, the residue was purified with silica gel column chromatography (elution solvent: ethyl acetate/ethanol=8/2) to obtain 3.86 g of a compound (I) at a yield of 48.8%.

$^1$H-NMR (CDCl$_3$): δ (ppm)=7.62 (d, J=12.3 Hz, 2H), 7.40-7.10 (m, 5H), 5.15 (d, J=12.3 Hz, 2H), 3.05 (broad s, 6H), 2.73 (broad s, 6H), 1.72 (s, 3H).

A 300 ml three-neck flask was charged with 3.86 g (12.8 mmol) of the compound (I), 1.3 ml of hydrazine monohydrate, and 230 ml of ethanol in a nitrogen atmosphere, and the mixture was refluxed with heating for 5 hours. The reaction solution was concentrated, and the residue was purified with silica gel column chromatography (elution solvent: ethyl acetate/ethanol=8/2) to obtain 2.88 g of a compound (J) at a yield of 94.1%.

$^1$H-NMR (CDCl$_3$): δ (ppm)=7.46 (d, J=2.1 Hz, 2H), 7.30-7.00 (m, 5H), 6.18 (d, J=2.1 Hz, 2H), 2.07 (s, 3H).

A 200 ml three-neck flask was charged with 0.50 g (2.1 mmol) of the compound (J), 5.71 g (21.0 mmol) of 3-iodo-benzo-trifluoride, 30 mg (0.21 mmol) of copper oxide, 115 mg (0.84 mmol) of salicylaldoxime, 2.73 g (14.2 mmol) of cesium carbonate, and 30 ml of butyronitrile in a nitrogen atmosphere, and the mixture was allowed to react at 140° C. for 18 hours. The reaction solution was filtered and concentrated. The obtained residue was purified with silica gel column chromatography (elution solvent: hexane/ethyl acetate=10/1) to obtain 795 mg of a compound (K) at a yield of 72%.

$^1$H-NMR (CDCl$_3$): δ (ppm)=7.97-7.82 (m, 6H), 7.57-7.47 (m, 4H), 7.58-7.46 (m, 4H), 6.39 (d, J=2.7 Hz, 2H), 2.29 (s, 3H).

A 50 ml recovery flask was charged with 393 mg (0.746 mmol) of the compound (K), 199 mg (0.748 mmol) of platinum(II) chloride, and 15 ml of benzonitrile in a nitrogen atmosphere, and the mixture was heated at 200° C. for 17 hours. After the temperature was lowered to room temperature, the reaction solution was concentrated under reduced pressure, the residue was purified with silica gel column chromatography (elution solvent: chloroform), and recrystallized from chloroform-methanol-hexane to obtain 180 mg of the compound (114) of the invention at a yield of 33%. The exemplified compound (114) of the invention emitted light at 460 nm in a dichloromethane solution at room temperature.

$^1$H-NMR (CDCl$_3$): δ (ppm)=8.24 (d, J=7.5 Hz, $^3J_{Pt-H}$=55.5 Hz, 2H), 7.97 (d, J=2.7 Hz, 2H), 7.55-7.23 (m, 9H), 6.27 (d, J=2.7 Hz, 2H), 2.22 (s, 3H).

Luminescent devices containing the compounds in the invention are described below. The luminescent devices in the invention can be used in ordinary luminescent system, driving methods and use forms, except for the point that the compound of the invention is used in the luminescent devices in the invention. As a representative luminescent device, an organic EL (electroluminescence) device can be exemplified.

It is preferred that the compound represented by formula (I) is used in a case where the luminescent device of the invention is used as a luminescent material, a host material, an exciton blocking material, a charge blocking material, or a charge transporting material, more preferably as a host material, a luminescent material, or a charge transporting material, and still more preferably as a luminescent material or a host material. When the luminescent device of the invention is used as a luminescent material, the emission may be ultraviolet emission, infrared emission, fluorescent emission, or phosphorescent emission. When used as a charge transporting material, it may be a hole transporting or electron transporting material.

In case that the compound of the invention use as the luminescent material in light-emitting layer, the compound contains from 0.1 to 40% by mass, preferably contains from 0.5 to 30% by mass, particularly preferably contains from 0.5 to 20% by mass.

Then, in case that the compound of the invention use as host material other than the luminescent material in light-emitting layer, the compound contains from 60 to 99.9% by mass, preferably contains from 70 to 99.5% by mass, particularly preferably contains from 80 to 99.5% by mass.

Further, in case that the compound of the invention contains in the layer other than the light-emitting layer, the compound contains from 0.1 to 100% by mass, preferably contains from 0.5 to 100% by mass, particularly preferably contains from 10 to 100% by mass.

(Organic Electroluminescent Device)

The organic electroluminescent device of the invention will be described in detail. The device of the invention has, on a substrate, a cathode and an anode, and has at least one organic compound layer (which is a light-emitting layer when only one organic compound layer is present) containing light-emitting layer, the Organic compound layer is between the electrodes. In consideration of the nature of the luminescent device, at least one electrode of the anode and cathode is preferably transparent.

In the device of the invention, the function of the organic compound layer is not particularly limited, and may be a hole injecting layer, a hole transporting layer, an electron injecting layer, an electron transporting layer, a hole blocking layer, an electron blocking layer, exciton blocking layer or a protective layer, in addition to the light-emitting layer. These layers each may simultaneously have other functions.

In the invention, the structure of the accumulated layers preferably contains a hole transporting layer, a light-emitting layer and an electron transporting layer in this order from the side of the anode. The device may further contain a charge blocking layer between the hole transporting layer and the light-emitting layer or between the light-emitting layer and the electron transporting layer. The device may further contain a hole injecting layer between the anode and the hole transporting layer, and may further contain an electron injecting layer between the cathode and the electron transporting layer. The layers each may be divided into plural secondary layers.

(Substrate)

The substrate used in the invention is preferably such a substrate that does not scatter or attenuate light emitted from the organic compound layer. Specific examples thereof include an inorganic material, such as yttria-stabilized zirconia (YSZ) and glass, and an organic material, such as a polyester, e.g., polyethylene terephthalate, polybutylene phthalate and polyethylene naphthalate, polystyrene, polycarbonate, polyethersulfone, polyarylate, polyimide, polycycloolefin, a norbornene resin and poly(chlorotrifluoroethylene).

In the case where glass is used as the substrate, for example, non-alkali glass is preferably used to reduce the amount of ion eluted from the glass. In the case where soda-lime glass is used, a barrier coating, such as silica, is preferably provided. In the case where an organic material is used, it is preferred to use a material excellent in heat resistance, dimensional stability, solvent resistance, electric insulation and workability.

The shape, structure and size of the substrate are not particularly limited, and can be appropriately selected corresponding to the application and purpose of the luminescent device. In general, the substrate preferably has a plate shape. The structure of the substrate may be a single layer structure or a multilayer structure, and may be constituted by a single member or plural members.

The substrate may be colorless and transparent or colored and transparent, and is preferably colorless and transparent from the standpoint that the light emitted from the light-emitting layer is not scattered or attenuated.

The substrate may have on the front or back surface thereof a moisture permeation preventing layer (gas barrier layer).

The material of the moisture permeation preventing layer (gas barrier layer) is preferably an inorganic material, such as silicon nitride and silicon oxide. The moisture permeation preventing layer (gas barrier layer) may be provided, for example, by the high frequency sputtering method. In the case where a thermoplastic substrate is used, a hardcoating layer and an undercoating may be provided depending on necessity.

(Anode)

It is generally sufficient that the anode has a function as an electrode supplying holes to the organic compound layer, and the shape, structure and size thereof are not particularly limited and may be appropriately selected from the group consisting of the known electrode materials corresponding to the application and purpose of the luminescent device. As having been described, the anode is generally provided in the form of a transparent anode.

Preferred examples of the material of the anode include a metal, an alloy, a metallic oxide, an electroconductive compound and a mixture thereof. Specific examples of the material of the anode include an electroconductive metallic oxide, such as tin oxide doped with antimony or fluorine (ATO and FTO), tin oxide, zinc oxide, indium oxide, indium tin oxide (ITO) and indium zinc oxide (IZO), a metal, such as gold, silver, chromium and nickel, a mixture and an accumulated product of the metal and the electroconductive metallic oxide, an inorganic electroconductive substance, such as copper iodide and copper sulfide, an organic electroconductive material, such as polyaniline, polythiophene and polypyrrole, and an accumulated product of ITO with them. Among these, an electroconductive metallic oxide is preferred, and ITO is particularly preferred from the standpoint of productivity, high electroconductivity and transparency.

The anode may be formed on the substrate by such a method that is appropriately selected in consideration of suitability to the material constituting the anode from the wet method, such as the printing method and the coating method, the physical method, such as the vacuum deposition method, the sputtering method and the ion plating method, and the chemical method, such as the CVD method and the plasma CVD method. For example, in the case where ITO is selected as the material of the anode, the anode can be formed by the direct current or high frequency sputtering method, the vacuum deposition method or the ion plating method.

In the device of the invention, the position where the anode is formed is not particularly limited, and may be appropriately selected corresponding to the application and purpose of the luminescent device, and the anode is preferably formed on the substrate. In this case, the anode may be formed on the whole one surface of the substrate, or may be formed at a part thereof.

The anode may be patterned upon forming by chemical etching, such as photolithography, by physical etching using, for example, laser, by vacuum deposition or sputtering by using a mask, or by the lift-off method or the printing method.

The thickness of the anode can be appropriately selected depending on the material constituting the anode and cannot be determined unconditionally. The thickness of the anode is generally about from 10 nm to 50 μm, and preferably from 50 nm to 20 μm.

The resistance of the anode is preferably $10^3 \Omega$ per square or less, and more preferably $10^2 \Omega$ per square or less. In the case where the anode is transparent, it may be colorless and transparent or colored and transparent. In order to take out emitted light from the side of the transparent anode, the transmittance of the anode is preferably 60% or more, and more preferably 70% or more.

The transparent anode is described in detail in *Tomei Denkyoku Maku no Shin Tenkai* (New Developments of Transparent Electrode Films), supervised by Y. Sawada, published by CMC Press (1999), and the descriptions therein can be applied to the invention. In the case where a plastic substrate having low heat resistance, the transparent anode is preferably formed by using ITO or IZO at a low temperature of 150° C. or lower.

(Cathode)

It is generally sufficient that the cathode has a function as an electrode injecting electrons to the organic compound layer, and the shape, structure and size thereof are not particularly limited and may be appropriately selected from the group consisting of the known electrode materials corresponding to the application and purpose of the device.

Examples of the material constituting the cathode include a metal, an alloy, a metallic oxide, an electroconductive compound and a mixture thereof. Specific examples thereof include an alkali metal (such as Li, Na, K and Cs), an alkaline earth metal (such as Mg and Ca), gold, silver, lead, aluminum, a sodium-potassium alloy, a lithium-aluminum alloy, a magnesium-silver alloy, and a rare earth metal, such as indium and ytterbium. These materials may be used solely and preferably used in combination of two or more kinds thereof from the standpoint that the stability and the electron injection property are simultaneously satisfied.

Among these materials, an alkali metal and an alkaline earth metal are preferred as the material constituting the cathode from the standpoint of electron injecting property, and a material mainly containing aluminum is preferred from the standpoint of excellent storage stability.

The material mainly containing aluminum herein is a sole aluminum material, or an alloy or a mixture of aluminum with from 0.01 to 10% by mass of an alkali metal or an alkaline earth metal (such as a lithium-aluminum alloy and a magnesium-aluminum alloy).

The material of the cathode is described in detail in JP-A-2-15595 and JP-A-5-121172, and the materials described therein can be applied to the invention.

The method for forming the cathode is not particularly limited, and the cathode may be formed by the known method. For example, it can be formed by a method that is appropriately selected in consideration of suitability to the material constituting the cathode from the wet method, such as the printing method and the coating method, the physical method, such as the vacuum deposition method, the sputtering method and the ion plating method, and the chemical method, such as the CVD method and the plasma CVD method. For example, in the case where a metal is selected as the material of the cathode, the cathode can be formed by the sputtering method with one kind of or plural kinds of metals simultaneously or sequentially.

The cathode may be patterned upon forming by chemical etching, such as photolithography, by physical etching using, for example, laser, by vacuum deposition or sputtering by using a mask, or by the lift-off method or the printing method.

In the device of the invention, the position where the cathode is formed is not particularly limited, and the cathode may be formed on the whole one surface of the organic compound layer, or may be formed at a part thereof.

A dielectric layer having a thickness of from 0.1 to 5 nm formed of a fluoride or an oxide of an alkali metal or an alkaline earth metal may be provided between the cathode and the organic compound layer. The dielectric layer can be understood as a certain type of an electron injecting layer. The dielectric layer can be formed, for example, by the vacuum-deposition method, the sputtering method or the ion plating method.

The thickness of the cathode can be appropriately selected depending on the material constituting the anode and cannot be determined unconditionally. The thickness of the cathode is generally about from 10 nm to 5 µm, and preferably from 50 nm to 1 µm.

The cathode may be transparent or opaque. The transparent cathode can be provided by forming a material of the cathode into a thin film having a thickness of from 1 to 10 nm, and further accumulating thereon a transparent electroconductive material, such as ITO and IZO.

(Organic Compound Layer)

The organic compound layer in the invention will be described.

The organic electroluminescent device of the invention has at least one organic compound layer including a light-emitting layer, and examples of the organic compound layer other than the light-emitting layer include a hole transporting layer, an electron transporting layer, a charge blocking layer, a hole injecting layer and an electron injecting layer, as having been described.

(Formation of Organic Compound Layer)

The layers constituting the organic compound layer in the organic electroluminescent device of the invention can be preferably formed by any method of the dry film forming method, such as the vapor deposition method and the sputtering method, the transfer method and the printing method.

(Light-Emitting Layer)

The light-emitting layer is a layer having such a function that upon application of an electric filed, holes are received from the anode, the hole injecting layer or the hole transporting layer, and electrons are received from the cathode, the electron injecting layer or the electron transporting layer, to provide a field for recombination of holes and electrons for luminescence.

The light-emitting layer in the invention may be formed solely of a luminescent material or may be a mixed layer of a host material and a luminescent material. The luminescent material may be either a fluorescence luminescent material or a phosphorescence luminescent material, and the dopant may be one kind or plural kinds. The host material is preferably a charge transporting material. The host material may be one kind or plural kinds, and examples thereof include a mixture of an electron transporting host material and a hole transporting host material. The light-emitting layer may contain such a material that has no charge transporting property and does not provide luminescence.

The light-emitting layer may contain one layer or plural layers, and the plural layers may have different luminescent colors.

Examples of the fluorescence luminescent material that can be used in combination with the compound of the invention include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perynone derivative, an oxadiazole derivative, an oxazine derivative, an aldazine derivative, a pyrralidine derivative, a cyclopentadiene derivative, a bisstyrylanthracene derivative, a quinacridone derivative, a pyrrolopyridine derivative, a thiadiazolopyridine derivative, a styrylamine derivative, a diketopyrrolopyrrole derivative, an aromatic dimethylidyne compound, a metallic complex, such as a metallic complex of a 8-quinolinol derivative and a metallic complex of a pyrromethene derivative, a polymer compound, such as polythiophene, polyphenylene and polyphenylenevinylene, and an organic silane derivative.

Examples of the ligand of the complex include those described in *Comprehensive Coordination Chemistry*, by G. Wilkinson, et al., published by Pergamon Press (1987), *Photochemistry and Photophysics of Coordination Compounds*, by H. Yersin, published by Springer-Verlag, Inc. (1987), and *Yuki Kinzoku Kagaku—Kiso to Oyo* (Organic Metal Chemistry—Fundamentals and Applications), by A. Yamamoto, published by Shokabo Co., Ltd. (1982).

Preferred specific examples of the ligand include a halogen ligand (preferably a chlorine ligand), a nitrogen-containing heterocyclic ligand (such as phenylpyridine, benzoquinoline, quinolinol, bipyridyl and phenanthroline), a diketone ligand (such as acetylacetone), a carboxylic acid ligand (such as an acetic acid ligand), a carbon monoxide ligand, an isonitrile ligand and a cyano ligand, and more preferably a nitrogen-containing heterocyclic ligand. The complex may have only one transition metal atom in the compound, or may be a so-called binuclear complex having plural transition metal atoms, which may contain plural kinds of metal atoms simultaneously.

The phosphorescence luminescent material that can be used in the invention is preferably used in combination with the metallic complex described in International Publication No. 04/099339, 04/006498 and 04/108857.

The phosphorescence luminescent material is preferably contained in the light-emitting layer in an amount of from 0.1 to 40% by mass, and more preferably from 0.5 to 20% by mass.

Examples of the host material contained in the light-emitting layer in the invention include a material having a carbazole skeleton, a material having a diarylamine skeleton, a material having a pyridine skeleton, a material having a pyrazine skeleton, a material having a triazine skeleton, a material having an arylsilane skeleton, and the meterials exemplified for the hole injecting layer, the hole transporting layer, the electron injecting layer and the electron transporting layer below.

The thickness of the light-emitting layer is not particularly limited, and in general, it is preferably from 1 to 500 nm, more preferably from 5 to 200 nm, and further preferably from 10 to 100 nm.

(Hole Injecting Layer and Hole Transporting Layer)

The hole injecting layer and the hole transporting layer are layers having such a function that holes are received from the anode or the side of the anode and transported to the side of the cathode. Specifically, the hole injecting layer and the hole transporting layer are preferably layers containing, for example, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound, an organic silane derivative or carbon.

The thickness of the hole injecting layer and the hole transporting layer is preferably 500 nm or less from the standpoint of decreasing the driving voltage.

The thickness of the hole transporting layer is preferably from 1 to 500 nm, more preferably from 5 to 200 nm, and further preferably from 10 to 100 nm. The thickness of the hole injecting layer is preferably from 0.1 to 200 nm, more preferably from 0.5 to 100 nm, and further preferably from 1 to 100 nm.

The hole injecting layer and the hole transporting layer may have a single layer structure containing one or plural kinds of the aforementioned materials, or may have a multi-layer structure containing plural layers having the same composition or different compositions.

(Electron Injecting Layer and Electron Transporting Layer)

The electron injecting layer and the electron transporting layer are layers having such a function that electrons are received from the cathode or the side of the cathode and transported to the side of the anode. Specifically, the electron injecting layer and the electron transporting layer are preferably layers containing, for example, a triazole derivative, an oxazole derivative, an oxadiazole derivative, an imidazole derivative, a fluorenone derivative, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, an aromatic tetracarboxylic anhydride, such as naphthalene and perylene, a phthalocyanine derivative, a metallic complex, such as a metallic complex of a 8-quinolinol derivative, metal phthalocyanine and a metallic complex having benzoxiazole or benzothiazole as a ligand, and an organic silane derivative.

The thickness of the electron injecting layer and the electron transporting layer is preferably 500 nm or less from the standpoint of decreasing the driving voltage.

The thickness of the electron transporting layer is preferably from 1 to 500 nm, more preferably from 5 to 200 nm, and further preferably from 10 to 100 nm. The thickness of the electron injecting layer is preferably from 0.1 to 200 nm, more preferably from 0.2 to 100 nm, and further preferably from 0.5 to 100 nm.

The electron injecting layer and the electron transporting layer may have a single layer structure containing one or plural kinds of the aforementioned materials, or may have a multilayer structure containing plural layers having the same composition or different compositions.

(Hole Blocking Layer)

The hole blocking layer is a layer having such a function that holes transported from the side of the anode to the light-emitting layer are prevented from penetrating to the side of the cathode. In the invention, the hole blocking layer may be provided as an organic compound layer adjacent to the light-emitting layer on the side of the cathode.

Examples of an organic compound constituting the hole blocking layer include an aluminum complex, such as BAlq, a triazole derivative, and a phenanthroline derivative, such as BCP. The thickness of the hole blocking layer is preferably from 1 to 500 nm, more preferably from 5 to 200 nm, and further preferably from 10 to 100 nm.

The hole blocking layer may have a single layer structure containing one or plural kinds of the aforementioned materials, or may have a multilayer structure containing plural layers having the same composition or different compositions.

(Protective Layer)

The device of the invention may be protected with a protective layer. The material contained in the protective layer may be a compound having such a function that substances accelerating deterioration of the device, such as water and oxygen, are prevented from entering into the device.

Specific examples of the compound include a metal, such as In, Sn, Pb, Au, Cu, Ag, Al, Ti and Ni, a metallic oxide, such as MgO, SiO, $SiO_2$, $Al_2O_3$, GeO, NiO, CaO, BaO, $Fe_2O_3$, $Y_2O_3$ and $TiO_2$, a metallic nitride, such as $SiN_x$ and $SiN_xO_y$, a metallic fluoride, such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water absorbing substance having a water absorption of 1% or more, and a moisture-proof substance having a water absorbance of 0.1% or less.

The method for forming the protective layer is not particularly limited, and examples thereof include the vacuum deposition method, the sputtering method, the reactive sputtering method, the MBE (molecular beam epitaxy) method, the cluster ion beam method, the ion plating method, the plasma polymerization method (the high-frequency excitation ion plating method), the plasma CVD method, the laser CVD method, the thermal CVD method, the gas source CVD method, the chording method, the printing method and the transfer method.

(Sealing)

The organic electroluminescent device of the invention may be sealed over the whole device by using a sealing container.

A water absorbent or an inert liquid may be filled in a space between the sealing container and the luminescent device. The water absorbent is not particularly limited, and examples thereof include barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite and magnesium oxide. The inert liquid is not particularly limited, and examples thereof include a paraffin compound, a liquid paraffin compound, a fluorine solvent, such as a perfluoroalkane, a perfluoroamine and a perfluoroether, a chlorine solvent, and a silicone oil.

The organic electroluminescent device of the invention provide luminescence by applying a direct current voltage (which may contain an alternating current component depending on necessity) generally having a voltage of from 2 to 15 V, or a direct electric current between the anode and the cathode.

Upon driving the organic electroluminescent device of the invention, the driving methods disclosed in JP-A-2-148687, JP-A-6-301355, JP-A-5-29080, JP-A-7-134558, JP-A-8-234685, JP-A-8-241047, Japanese Patent No. 2,784,615, and U.S. Pat. No. 5,828,429 and U.S. Pat. No. 6,023,308 can be applied.

EXAMPLE

The invention will be described in more detail with reference to the following example, but the invention is not construed as being limited thereto.

(Compounds described in International Publication 2004/108857)

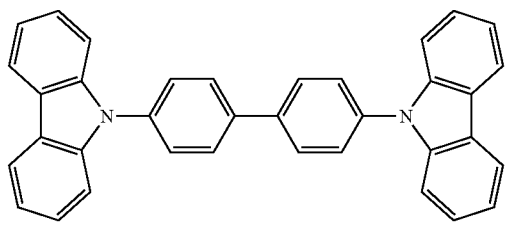
CBP

-continued

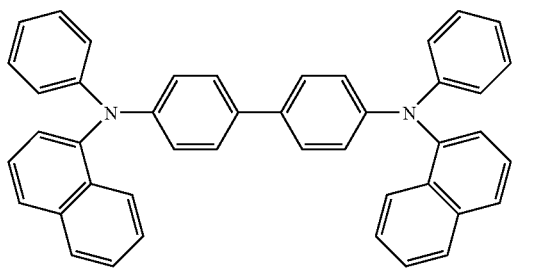
NPD

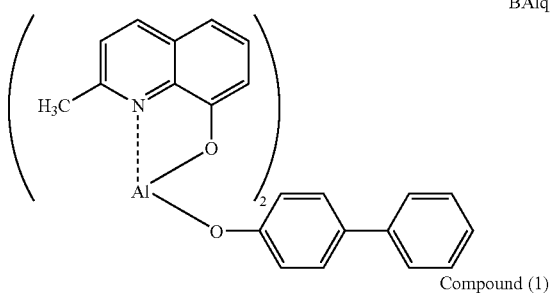
BAlq

Compound (1)

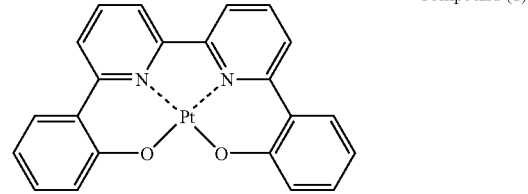
Compound (79)

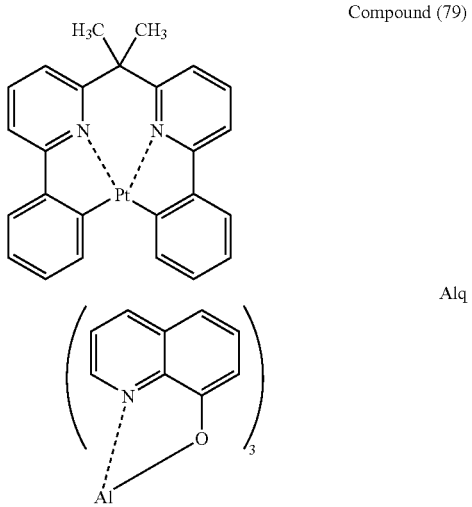
Alq

Comparative Example 1

A cleaned ITO substrate was placed in a vapor deposition apparatus, and NPD was vapor-deposited on the substrate to 50 nm, CBP and Compound (1) disclosed in International Publication No. 2004/108857 were vapor-deposited thereon at a mass ratio of 10/1 to 40 nm, BAlq was vapor-deposited thereon to 10 nm, and Alq was vapor-deposited thereon to 30 nm. A patterned mask (providing a luminescent area of 4 mm×5 mm) was placed on the resulting organic thin films, on which lithium fluoride was vapor-deposited to 3 nm and aluminum was then vapor-deposited to 60 nm, so as to produce an organic electroluminescent device of Comparative Example 1. The resulting organic electroluminescent device was applied with a constant direct current (5 V), and thus luminescence was observed. The device provided luminescence at a brightness of 300 cd/m² for 10 hours.

Example 1

An organic electroluminescent device of Example 1 was produced in the same manner as in Comparative Example 1 except that the compound (1) of the invention was used instead of Compound (1) disclosed in International Publication No. 2004/108857. The resulting organic electroluminescent device was applied with a constant direct current (5 V), and thus luminescence was observed. When the device provided luminescence at a brightness of 300 cd/m² for 10 hours, the luminescent wavelength was shorter than that in Comparative Example 1.

Example 2

An organic EL device in Example 1 was manufactured in the same manner as in Comparative Example 1, except that the Compound (101) of the invention was used in place of the Compound (1) used in Comparative Example 1. When direct current constant voltage (5V) was applied to the obtained organic EL device, luminescence was observed. When the device provided luminescence at a brightness of 300 cd/m² for 10 hours, the luminescent wavelength was shorter than that in the Comparative Example 1. When compared with the device described in Example 1, the external quantum efficiency of the device was lower.

Comparative Example 2

A cleaned ITO substrate was placed in a vapor deposition apparatus, and NPD was vapor-deposited on the substrate to 50 nm, CBP and Compound (79) (disclosed in International Publication No. 2004/108857) were vapor-deposited thereon at a mass ratio of 10/1 to 40 nm, BAlq was further vapor-deposited thereon to 3 nm, and Alq was still further vapor-deposited thereon to 30nm. A patterned mask (providing a luminescent area of 4 mm×5 mm) was placed on the resulting organic thin films, on which lithium fluoride was vapor-deposited to 3 nm and aluminum was then vapor-deposited to 60 nm, so as to produce an organic EL device in Comparative Example 2. The resulting organic EL device was applied with a constant direct current of current density of 500 A/m², and thus luminescence was observed. The device provided luminescence at a brightness of 200 cd/m² for 10 hours.

Example 3

An organic EL device in Example 3 was manufactured in the same manner as in Comparative Example 1, except that the Compound (114) of the invention was used in place of Balq used in Comparative Example 1. The resulting organic EL device was applied with a constant direct current of current density of 500 A/m², and thus luminescence was observed. When the device provided luminescence at a brightness of 200 cd/m² for 10 hours, the driving voltage was lower and the increase width in voltage was also smaller than those in the Comparative Example 2.

Electroluminescent devices that are excellent in luminescent capability can be produced by using the other compounds of the invention. The compounds of the invention provide phosphorescent luminescence of blue to green, and organic electroluminescent devices that provide phosphorescent luminescence of blue to green can be produced by using the compounds of the invention.

INDUSTRIAL APPLICABILITY

The organic electroluminescent device of the invention can be favorably applied to the fields of a display device, a display apparatus, a back light, electrophotography, an illumination light source, a recording light source, an exposure light source, a readout light source, a sign, an advertising board, interior, and optical communication. The compound of the invention can be applied to the fields of medical use, a fluorescent whitening agent, a photographic material, an UV absorbent, a laser colorant, a material for a recording medium, a pigment for ink-jet recording, a dye for a color filter, a color conversion filter, and analytical use.

The present application claims foreign priority based on Japanese Patent Application (No. JP 2005-070992) filed Mar. 14 of 2005 and Japanese Patent Application (No. JP 2005-256797) filed Sep. 5, 2005, and the contents thereof are incorporated herein by reference.

What is claimed is:

1. An organic electroluminescent device comprising:
a pair of electrodes; and
an organic compound layer comprising a light-emitting layer, the organic compound layer being between the electrodes,
wherein the organic compound layer comprises at least one compound represented by formula (IIB1):

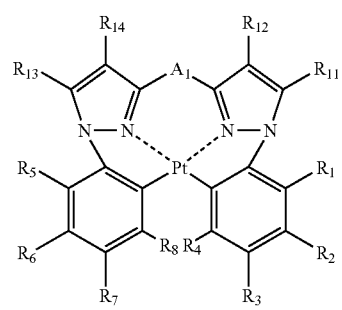

Formula (IIB1)

wherein $A_1$ represents a divalent linking group; and
$R_1, R_2, R_3, R_4, R_5, R_6, R_7, R_8, R_{11}, R_{12}, R_{13}$, and $R_{14}$ each independently represent a hydrogen atom or a substituent, with the proviso that none of $R_1$-$R_4$ connects to any of $R_5$-$R_8$ to form a ring.

2. The organic electroluminescent device as claimed in claim 1, wherein $R_2$ and $R_6$ each represent a hydrogen atom.

3. The organic electroluminescent device as claimed in claim 1, wherein A1 represents a group selected from the group consisting of —C($R_{25}$)($R_{26}$)—, —C($R_{27}$)($R_{28}$)C($R_{29}$)($R_{30}$)—, —Si($R_{31}$)($R_{32}$)—, —N($R_{35}$)—, —O—, —S—, —SO—, —SO$_2$— and —CO—, wherein $R_{25}, R_{26}, R_{27}, R_{28}, R_{29}, R_{30}, R_{31}, R_{32}$ and $R_{35}$ each independently represents a hydrogen atom or a substituent.

4. The organic electroluminescent device as claimed in claim 1, wherein $R_1$ to $R_8$ each independently represents a hydrogen atom, an alkyl group, an aryl group, a halogen atom, or a cyano group.

5. The organic electroluminescent device as claimed in claim 1, wherein $R_{11}$ to $R_{14}$ each independently represents a hydrogen atom, an alkyl group, or an aryl group.

6. The organic electroluminescent device as claimed in claim 1, wherein $A_1$ represents —C($R_{25}$)($R_{26}$)— or —C($R_{27}$)($R_{28}$)C($R_{29}$)($R_{30}$)—, wherein $R_{25}$, $R_{26}$, $R_{27}$, $R_{28}$, $R_{29}$, and $R_{30}$ each independently represents a hydrogen atom or a substituent.

7. The organic electroluminescent device as claimed in claim 6, wherein $R_{25}$, $R_{26}$, $R_{27}$, $R_{28}$, $R_{29}$, and $R_{30}$ each independently represents a hydrogen atom, an alkyl group, or an aryl group.

8. A luminescent material comprising:
a compound represented by formula (IIB1):

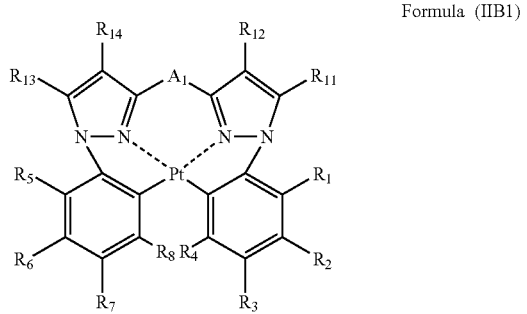

Formula (IIB1)

wherein $A_1$ represents a divalent linking group; and
$R_1$, $R_2$, $R_3$, $R_4$, $R_5$, $R_6$, $R_7$, $R_8$, $R_{11}$, $R_{12}$, $R_{13}$, and $R_{14}$ each independently represent a hydrogen atom or a substituent, with the proviso that none of $R_1$-$R_4$ connects to any of $R_5$-$R_8$ to form a ring.

9. A light-emitting layer comprising:
a compound represented by formula (IIB1):

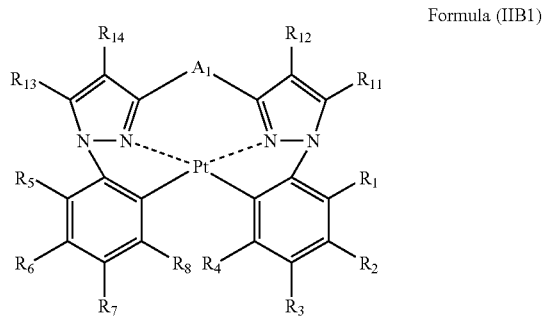

Formula (IIB1)

wherein $A_1$ represents a divalent linking group; and
$R_1$, $R_2$, $R_3$, $R_4$, $R_5$, $R_6$, $R_7$, $R_8$, $R_{11}$, $R_{12}$, $R_{13}$, and $R_{14}$ each independently represent a hydrogen atom or a substituent, with the proviso that none of $R_1$-$R_4$ connects to any of $R_5$-$R_8$ to form a ring.

10. A display device comprising:
the organic electroluminescent device claimed in claim 1.

11. A display apparatus comprising:
the organic electroluminescent device claimed in claim 1.

12. An illumination light comprising:
the organic electroluminescent device claimed in claim 1.

* * * * *